United States Patent
Komoda

[11] Patent Number: 6,073,265
[45] Date of Patent: Jun. 6, 2000

[54] PIPELINE CIRCUIT WITH A TEST CIRCUIT WITH SMALL CIRCUIT SCALE AND AN AUTOMATIC TEST PATTERN GENERATING METHOD FOR TESTING THE SAME

[75] Inventor: Michio Komoda, Hyogo, Japan

[73] Assignee: Mitsubishi Denki Kabushiki Kaisha, Tokyo, Japan

[21] Appl. No.: 09/100,025

[22] Filed: Jun. 19, 1998

[30] Foreign Application Priority Data

Jan. 13, 1998 [JP] Japan .................................. 10-004691

[51] Int. Cl.⁷ ...................................................... G06F 11/00
[52] U.S. Cl. ........................................... 714/738; 714/724
[58] Field of Search .................... 714/724, 738, 714/742

[56] References Cited

U.S. PATENT DOCUMENTS

| | | | |
|---|---|---|---|
| 5,640,403 | 6/1997 | Ishiyama et al. | 714/737 |
| 5,668,481 | 9/1997 | Sheu et al. | 326/16 |
| 5,930,271 | 7/1999 | Takahashi | 714/738 |
| 6,014,763 | 1/2000 | Dhong et al. | 714/724 |

FOREIGN PATENT DOCUMENTS

| | | |
|---|---|---|
| 63-157073 | 6/1988 | Japan . |
| 5-264656 | 10/1993 | Japan . |

*Primary Examiner*—Phung M. Chung
*Attorney, Agent, or Firm*—McDermott, Will & Emery

[57] ABSTRACT

A pipeline circuit with a test circuit in small circuit scale includes a pipeline circuit including a plurality of groups of flipflops arranged in series and a plurality of combinational circuits respectively arranged between the plurality of groups of flipflops and each having an input connected to an output of a group of flipflops at a previous stage and an output connected to a group of flipflops at a subsequent stage. The plurality of groups of flipflops include groups of flipflops subjected to scan conversion and groups of flipflops not subjected to scan conversion. The pipeline circuit, with a test circuit also includes a scan chain interconnecting the groups of flipflops subjected to scan conversion. An automatic test pattern generating method for testing the pipeline circuit with a test circuit, is also claimed.

19 Claims, 24 Drawing Sheets

PIPELINE CIRCUIT WITH A TEST CIRCUIT WITH SMALL CIRCUIT SCALE AND AN AUTOMATIC TEST PATTERN GENERATING METHOD FOR TESTING THE SAME

BACKGROUND OF THE INVENTION

1. Field of the Invention

The present invention relates to a pipeline circuit with a test circuit and an automatic test pattern generating method for testing the same, and particularly to a pipeline circuit with a test circuit with small circuit scale and an automatic test pattern generating method for testing the same.

2. Description of the Background Art

Test Pattern generation for pipeline circuit generally employs engineering work station.

The pipeline circuit in the present specification includes groups of flipflops (FFs) at n stages arranged in series, and combinational circuits located between the groups of FFs at the respective stages. A combinational circuit located between the group of FFs at the i-th stage and the group of FFs at the (i+1)th stage receives an output from the group of FFs at the i-th stage, performs a predetermined logical operation on the output and then input its output value to the group of FFs at the (i+1)th stage.

Referring to FIG. 1 a pipeline circuit 220 includes: a group of FFs 60A at a first stage; a combinational circuit 62A for receiving a value held by the group of FFs 60A and performing a predetermined logical operation thereon; a group of FFs 60B at a second stage for receiving the operation result of combinational circuit 62A and holding the value; a combinational circuit 62B for receiving the value held by the group of FFs 60B and performing a predetermined logical operation thereon; a group of FFs 60C at a third stage for receiving the operation result of combinational circuit 62B and holding the value; a combinational circuit 62C for receiving the value held by the group of FFs 60C and performing a predetermined logical operation thereon; a group of FFs 60D at a fourth stage for receiving the operation result of combinational circuit 62C and holding the value; a combinational circuit 62D for receiving the value held by the group of FFs 60D and performing a predetermined logical operation thereon; and a group of FFs 60E at a fifth stage for receiving the operation result of combinational circuit 62D and holding the value.

The pipeline circuit 220 thus configured is often used in the large scale integration (LSI) for operation processing so as to implement rapid processing using transistors with limited processing performance. However, LSI, incapable of direct circuit inspection, requires consideration to the method of testing it, and scan test is considered as one technique for the method. A method of a universal, automatic test pattern generation (ATPG) for scan test for pipeline circuit 220 includes full scan ATPG and partial scan ATPG.

All of the FFs configuring pipeline circuit 220 are subjected to scan conversion to provide the FIG. 2 pipeline circuit 222 which also includes scan chain 93 interconnecting each of the groups of FFs 60A–60E. Pipeline circuit 222 thus subjected to scan conversion allows the operator to provide shift operation via scan chain 93. Thus, the operator can readily set a value of a scan FF (i.e. a FF subjected to scan conversion) via a scan-in terminal 65 and observe it via a scan-out terminal 67.

A processing procedure of full scan ATPG will now be described with reference to FIG. 3. Combinational circuits 62A–62D are extracted from pipeline circuit 222 after scan conversion (S32). An ATPG according to a predetermined method is applied for each of combinational circuits 62A–62D extracted at S32 (S34). Test patterns generated in the processing at S34 are those for combinational circuits 62A–62D and cannot be used for scan test as they are. Accordingly, the test patterns are formatted to provide test patterns for scan test (S36). For example, a test pattern for combinational circuit 62A prior to the formatting represents a relation between an input value and an output value of combinational circuit 62A. In scan test, the input value successively shifts while it is read via scan-in terminal 65, to set a value input to each FF of the group of FFs 60A. Then, a capture clock is applied one time to combinational circuit 62A and an output value is received by each FF of the group of FFs 60B. Then, a shift operation is provided a predetermined number of times and the output value of combinational circuit 62A is observed from scan-out terminal 67. To allow such a scan test, the processing at S36 provides a predetermined formatting for test patterns.

Thus, full scan ATPG can generate a test pattern which ensures testing all combinational circuits. The test pattern is also compact and provides wide fault detection coverage.

A processing procedure of partial scan ATPG will now be described with reference to FIGS. 4 and 5. Pipeline circuit 220 is analyzed and the FFs are arranged in the order of poor controllability/observability (S42). The number of FFs subjected to scan conversion (i.e. the total number of FFs in the circuit multiplied by a given scan rate) is calculated and the FFs are subjected to scan conversion in the order of poor controllability/observability (S44). Referring to FIG. 5, the scan conversion results in a pipeline circuit 224 as one example.

The controllability of a FF is determined depending on whether the data of the FF can readily be set as desired by the user only via an input port external to the LSI. For example, among the FFs configuring a multibit counter, the FF corresponding to the most significant bit of a counter value is considered as having poor controllability, since changing the value of the FF requires a great number of clocks to be applied to the multibit counter. It should be noted, however, that the controllability of a FF is determined relatively and varies depending on the peripheral circuitry.

The observability of a FF is determined depending on whether the value of the FF can readily be observed via an output port (not shown) of the LSI. For example, a long logical pass provided between a FF and the output port that also includes a large number of FFs thereon makes it difficult to transmit the value of the FF to the output port and thus generally results in a poor observability of the FF.

An ATPG is performed for a sequential circuit for conducting a scan test via a scan path 95 of pipeline circuit 224 (S46). Finally, a test pattern, is formatted, as in the processing of full scan ATPG (S48).

The processing of full scan ATPG described above can ensure testing all combinational circuits and generate a compact test pattern with wide fault detection coverage. However, the FFs included in a pipeline circuit all require scan conversion and the scan FFs result in increasing the scale of the test circuit.

By contrast, the processing of partial scan ATPG does not require all of the FFs to be subjected to scan conversion. Accordingly, low scan rate can be set to reduce the scale of the test circuit. However, it is generally difficult to provide the ATPG processing for the sequential circuit. Also, the lowered scan rate disadvantageously decreases the rate of failure detection and results in enormous test pattern. Furthermore, since test pattern generation is provided taking into consideration the state of the sequential circuit, pipeline circuit 224 need be generally processed as a whole. However, the current performance of engineering work station cannot allow for circuits of large scale.

SUMMARY OF THE INVENTION

The present invention is provided to solve such problems.

One object of the present invention is to provide a pipeline circuit with a test circuit small in circuit scale.

Another object of the present invention is to provide a pipeline circuit with a test circuit which is small in circuit scale and also facilitates interconnection.

Still another object of the present invention is to provide an automatic test pattern generating method which employs a pipeline circuit with a test circuit small in circuit scale to ensure testing combinational circuits and generate a test pattern which is compact and provides wide fault detection coverage.

A pipeline circuit with a test circuit in one aspect of the present invention includes a pipeline circuit including: a plurality of groups of flipflops arranged in series; and a plurality of combinational circuits respectively arranged between the plurality of groups of flipflops and each having an input connected to an output of a group of flipflops at a previous stage, and an output connected to a group of flip-flops at a subsequent stage. The plurality of groups of flipflops include groups of flipflops subjected to scan conversion and groups of flipflops not subjected to scan conversion. The pipeline circuit with a test circuit also includes a scan chain which interconnects the groups of flipflops subjected to scan conversion.

Since some groups of flipflops are only subjected to scan conversion, the pipeline circuit with a test circuit can be reduced in scale.

Preferably, the groups of flipflops subjected to scan conversion are those of flipflops with a predetermined number of stages interposed therebetween.

Since a group of flipflops included in the pipeline circuit with a test circuit that is subjected to scan conversion is that of flipflops subjected to scan conversion at every predetermined number of stages, the pipeline circuit with a test circuit can be reduced in scale.

Still preferably, the predetermined number of stages is equal to the number of combinational circuits.

The groups of flipflops included in the pipeline circuit with a test circuit that are subjected to scan conversion can include a group of flipflops at the first stage and a group of flipflops at the last stage to minimize the number of groups of flipflops subjected to scan conversion and thus reduce the scale of the pipeline circuit with a test circuit.

Still preferably, the pipeline circuit with a test circuit includes first and second pipeline circuits and a scan chain of the first pipeline circuit and a scan chain of the second pipeline circuit are interconnected.

The two pipeline circuits with a test circuit can each include a group of flipflops subjected to scan conversion at every predetermined number of stages to reduce the scale of each pipeline circuit with a test circuit.

Still preferably, the predetermined number of stages of the first pipeline circuit is equal to that of stages of the second pipeline circuit.

The two pipeline circuits with a test circuit can each include groups of flipflops subjected to scan conversion that are equally spaced in arrangement. Thus, a test result can be taken into the groups of flipflops subjected to scan conversion all at once with application of a same capture clock to reduce the number of produced test patterns (after pattern formatting).

Still preferably, adjacent ones of groups of flipflops subjected to scan conversion sandwich a largest number of stages. Of two adjacent groups of flipflops with stages smaller in number than the largest value interposed therebetween, the group of flipflops at the previous stage is a group of flipflops with data holding function.

Only a group of flipflops at a previous stage of a set of groups of flipflops other than a set of groups of flipflops with a largest number of combinational circuits interposed between groups of flipflops subjected to scan conversion, is a group of flipflops with data holding function. Thus, the number of groups of flipflops with data holding function can be minimized in using the groups of flipflops with data holding function to conduct a scan test, to reduce the scale of the pipeline circuit with a test circuit. Furthermore, if the frequency of application of a capture clock in scan test is equal to the largest number of combinational circuits interposed between groups of flipflops, a group of flipflops with data holding function can provide adjustment as to whether data is held so that a test result is held in a group of flipflops at a subsequent stage after application of the capture clock.

Still preferably, the pipeline circuit also includes a non-pipeline circuit including a plurality of groups of flipflops subjected to scan conversion and arranged in series, a combinational circuit, and a scan chain interconnecting the plurality of groups of flipflops subjected to scan conversion. A scan chain included in a portion other than the non-pipeline circuit is interconnected to the scan chain included in the non-pipeline circuit.

The portion other than the non-pipeline circuit of the pipeline circuit with a test circuit, has only some groups of flipflops subjected to scan conversion to reduce the scale of the pipeline circuit with a test circuit.

A pipeline circuit with a test circuit in another aspect of the present invention includes first and second pipeline circuits each including: a plurality of groups of flipflops arranged in series; and a plurality of combinational circuits respectively arranged between the plurality of groups of flipflops and each having an input connected to an output of a group of flipflops at a previous stage and an output connected to a group of flipflops at a subsequent stage. Among the plurality of groups of flipflops of each of the first and second pipeline circuits, a group of flipflops at the first stage and a group of flipflops at the last stage are both subjected to scan conversion. The pipeline circuit with a test circuit also includes a first scan chain interconnecting the groups of flipflops at their respective first stages of the first and second pipeline circuits and a second scan chain interconnecting the groups of flipflops at their respective last stages of the first and second pipeline circuits.

Since a group of flipflops at the first stage and that of flipflops at the last stage are only subjected to scan conversion and the scan chain for connecting the groups of flipflops subjected to scan conversion at the first stages is separated from that for connecting the groups of flipflops subjected to scan conversion at the last stages, the pipeline circuit with a test circuit can be reduced in scale and also facilitate interconnection.

In still another aspect of the present invention, an automatic test pattern generating method is provided for testing a pipeline circuit with a test circuit including a pipeline circuit having: a plurality of groups of flipflops arranged in series; and a plurality of combinational circuits respectively arranged between the plurality of groups of flipflops and each having an input connected to an output of a group of flipflops at a previous stage and an output connected to a group of flipflops at a subsequent stage. The plurality of groups of flipflops include groups of flipflops subjected to scan conversion and groups of flipflops not subjected to scan conversion. The pipeline circuit with a test circuit also includes a scan chain interconnecting the groups of flipflops subjected to scan conversion. The automatic test pattern generating method includes, for each of combinational circuits configuring each pipeline circuit, the steps of: constructing a data base capable of automatic test pattern generation with a plurality of combinational circuits between groups of flipflops subjected to scan conversion assumed as one circuit; generating a full-scan automatic test pattern based on the data base; and formatting the full-scan automatic test pattern to provide a test pattern for scan test.

A test pattern is generated which can apply a capture clock so that an output of a combinational circuit is passed through a group of flipflops not subjected to scan conversion, to ensure testing the combinational circuit and generate a test pattern with wide fault detection coverage, as in an example with all of the flipflops subjected to scan conversion.

The step of formatting preferably includes: a first test pattern outputting step based on the test pattern for full-scan test, of outputting a test pattern to set data for a group of flipflops subjected to scan conversion in scan test via a scan chain from an input terminal; a second test pattern outputting step of outputting a test pattern to apply a capture clock a predetermined number of times determined so that the data set for the group of flipflops subjected to scan conversion is taken into each of combinational circuits successively; and a third test pattern outputting step of outputting a test pattern for reading the data held in the group of flipflops subjected to scan conversion via an output terminal and observing the read data via the scan chain.

Still preferably, a group of flipflops subjected to scan conversion is that provided at every predetermined number of stages, and the second test pattern outputting step includes outputting such a test pattern that the number of capture clocks applied is equal to the predetermined number of stages.

Still preferably, the pipeline circuit with a test circuit includes first and second pipeline circuits. A scan chain of the first pipeline circuit and a scan chain of the second pipeline circuit are interconnected. A predetermined number of stages in the first pipeline circuit is larger than a predetermined number of stages in the second pipeline circuit. Among a plurality of groups of flipflops in the second pipeline circuit, a group of flipflops at the most previous stage has data holding function. The group of flipflops with data holding function is configured of a scan flipflop with data holding function including a first selector, a second selector and a flipflop. The first selector has two inputs respectively connected to an internal data signal and an output of the flipflop and an output connected to an input of the second selector, and determines a state in response to a data hold signal. The second selector has two inputs respectively connected to an output of the first selector and an output of a flipflop at a previous stage and an output connected to an input of the flipflop, and determines a state in response to a scan enable signal. The flipflop has an input connected to an output of the second selector at an output connected to an input of the first selector. The second test pattern outputting step includes outputting such a test pattern that the number of capture clocks applied is equal to the largest one of first predetermined numbers of stages and the data hold signal is set to allow the first selector to output an output of the flipflop while the scan enable signal is set to allow the second selector to output an output of the first selector when a capture clock is applied.

A test pattern generation is performed for a pipeline circuit with a test circuit including a group of flipflops provided with data holding function. The frequency of application of capture clock is determined to allow scan test for a pipeline circuit including the largest number of combinational circuits. A pipeline circuit other than that including the largest number of combinational circuits has a group of flipflops at the first stage provided with data holding function. Accordingly, by holding data, a value after passing through a combinational circuit can be held in a group of flipflops at the last stage after application of the capture clock described above, to ensure testing the combinational circuit and generate a test pattern which is compact and provides wide fault detection coverage, as in an example with all of the flipflops subjected to scan conversion.

Still preferably, adjacent ones of the groups of flipflops subjected to scan conversion sandwich a largest number of stages. Of two adjacent groups of flipflops with stages of a number smaller than the largest number interposed therebetween, the group of flipflops at the previous stage has data holding function. The second test pattern outputting step includes the step of applying a capture clock max_s times, and outputting such a test pattern that the data hold signal is set to allow the first selector to output an output of the flipflop and the scan enable signal is set to allow the second selector to output an output of the first selector when the first to the (max_s–min_s)th capture clocks are applied and also outputting such a test pattern that the data hold signal is set to allow the first selector to output an internal data signal and the scan enable signal is set to allow the second selector to output an output of a flipflop at a previous stage when the (max_s)th capture clock is applied.

"Max_s" represents the largest one of numbers of combinational circuits interposed between sets of groups of flipflops subjected to scan conversion, and "min_s" is the smallest one of numbers of combinational circuits interposed between sets of groups of flipflops subjected to scan conversion.

Such a test pattern is generated that the data of a group of scan flipflops with data holding function is held in application of the first to the (max_s–min_s)th capture clocks and the data of the group of scan flipflops with data holding function are not held and an output of a combinational circuit is held in application of the (max_s)th capture clock, to ensure testing the combinational circuit and generate a test pattern which is compact and provides wide fault detection coverage, as in an example with all of the flipflops subjected to scan conversion.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
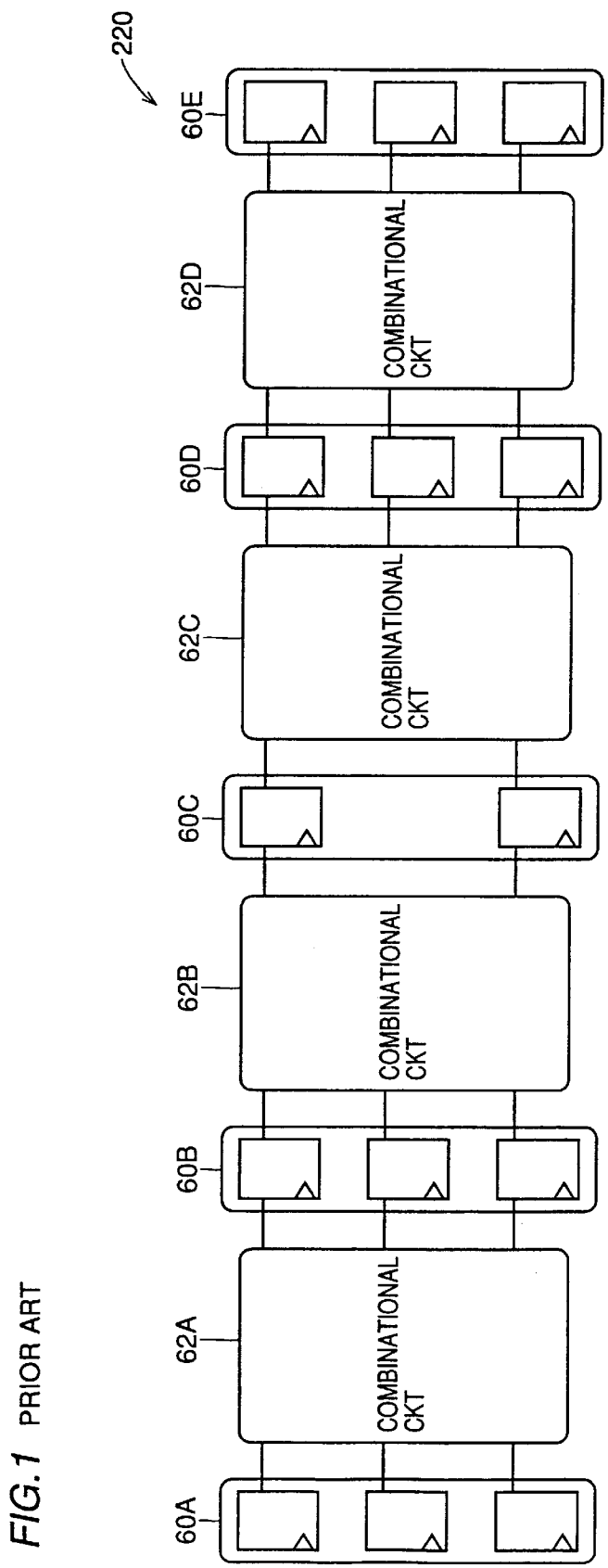
FIG. 1 is a circuit diagram showing a conventional pipeline circuit 220.
Figure 2:
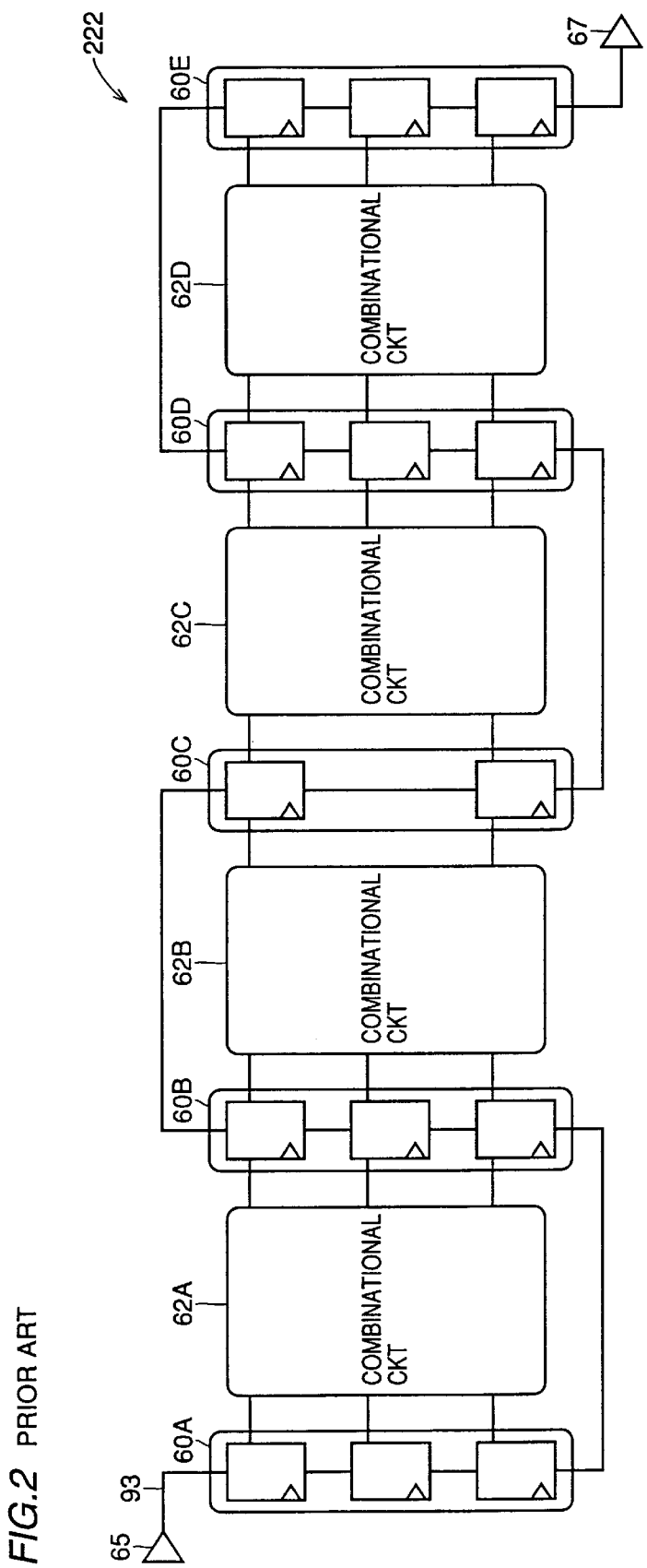
FIG. 2 is a circuit diagram showing a conventional pipeline circuit 222.

An automatic test pattern generating device for pipeline circuit according to a first embodiment, and an automatic test pattern generating method employing the same will now be described with reference to the drawings. In the following description, identical parts are denoted by a same reference character. The name and function thereof are also the same and a description thereof is thus not repeated where appropriate.

Figure 6:
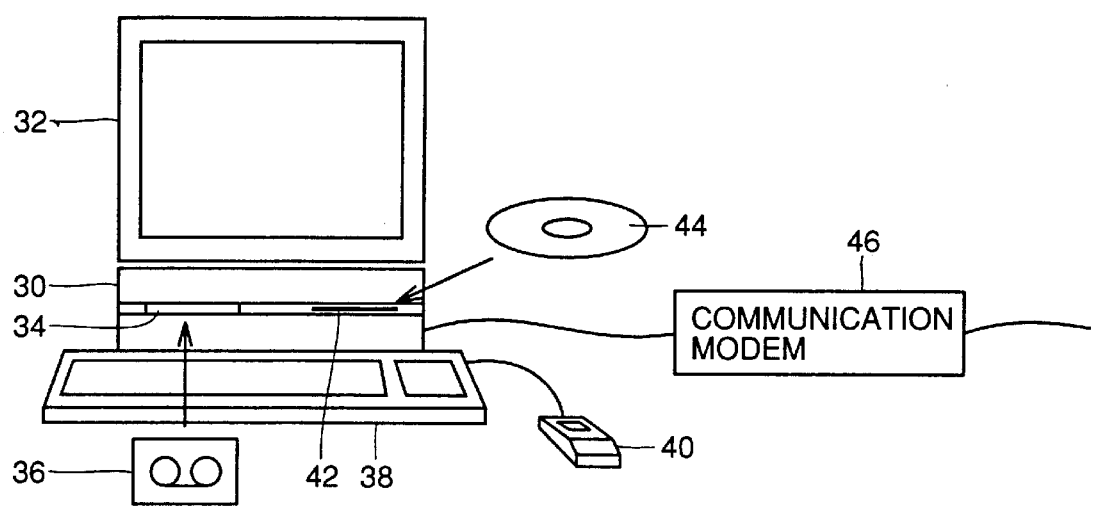
FIG. 6 is a schematic view of an automatic test pattern generating device for a pipeline circuit according to a first embodiment of the present invention.

Referring to FIG. 6, an automatic test pattern generating device for pipeline circuit includes an engineering work station (EWS) 30, a keyboard 38 and a mouse 40 for providing indications to EWS30, a display 32 for displaying results of logic circuit synthesis and the like operated by EWS30, and a magnetic tape device 34, a compact disk-read only memory (CD-ROM) device 42 and a communication modem 46 for respectively reading programs run by EWS30.

The program for providing results of logic circuit synthesis of transistor is recorded on magnetic tape 36 or a CD-ROM 44 as a recording medium readable by EWS30. The program is read by magnetic tape device 34 and CD-ROM device 42, respectively, or by communication modem 46 via a communication line.

Figure 7:
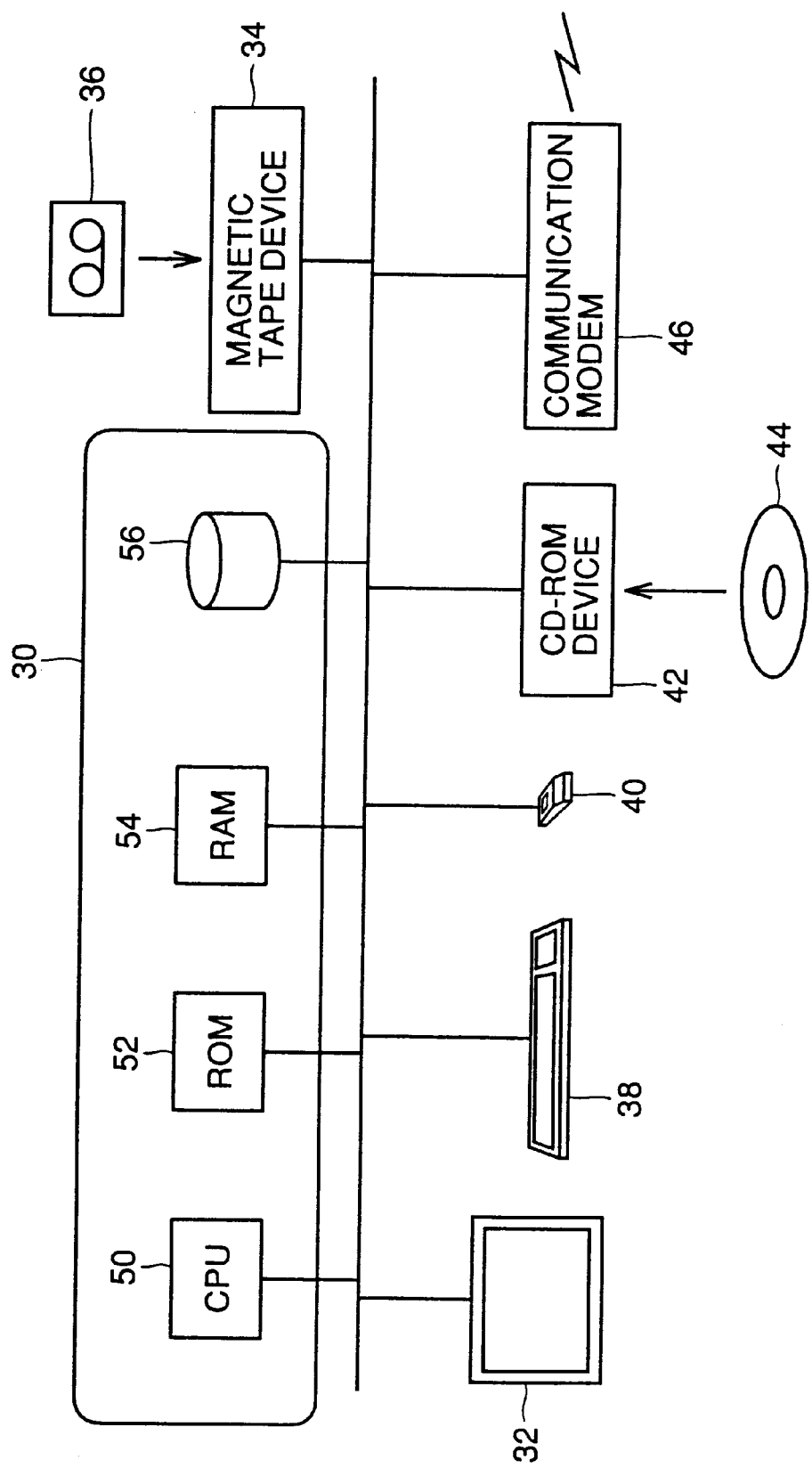
FIG. 7 is a block diagram showing a configuration of the automatic test pattern generating device for a pipeline circuit according to the first embodiment.

Referring to FIG. 7, EWS30 includes a central processing unit (CPU) 50 for running programs read via magnetic tape device 34, CD-ROM device 42 or communication modem 46, a read only memory (ROM) 52 for storing other programs and data required for the operation of EWS30, a random access memory (RAM) 54 for storing programs, parameters in running the programs, operation results and the like, and a magnetic disk 56 for storing programs, data and the like.

An automatic test pattern generating method will now be described which employs an automatic test pattern generating device.

Figure 8:
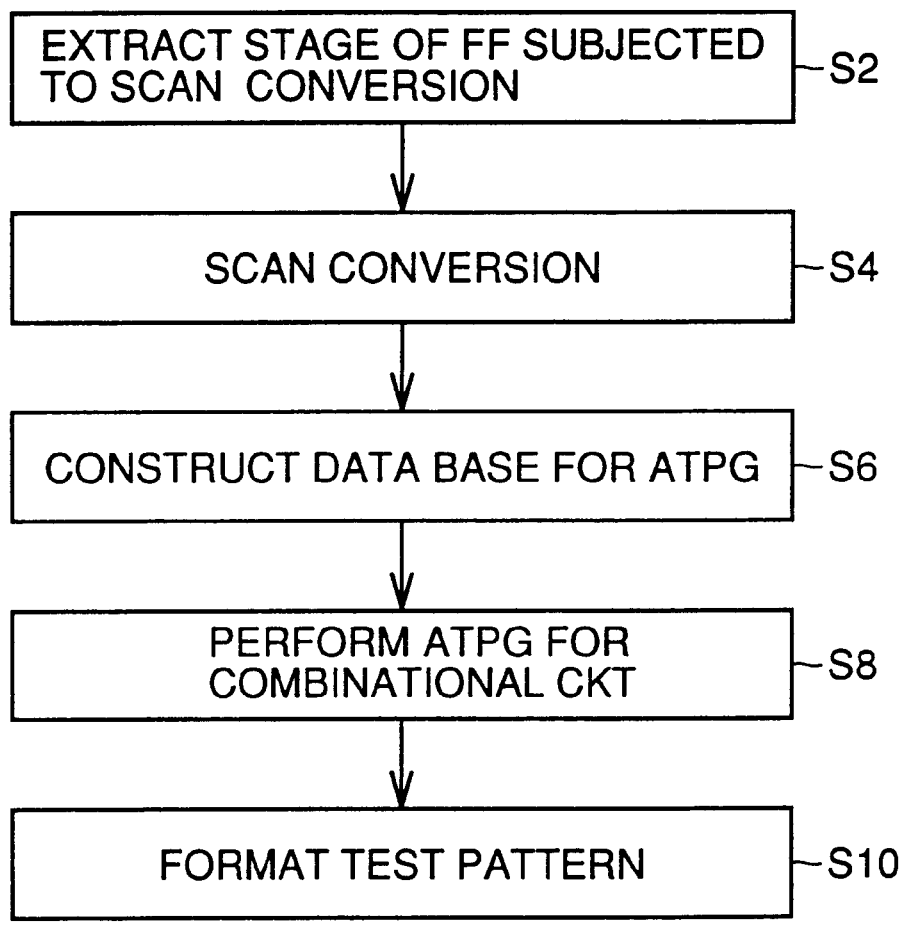
FIG. 8 is a flow chart of an operation of an automatic test pattern generating device according to the first embodiment.

Referring to FIGS. 1 and 8, a pipeline circuit 220 includes groups of FFs 60A–60E at five stages arranged in series, and a group of FFs is extracted from the groups of FFs 60A–60E for every n stages (referred to as the number of stages subjected to scan conversion n hereinafter), wherein n≧2. For example, for n=2, the groups of FFs 60A, 60C and 60E are extracted from pipeline circuit 220.

Figure 9:
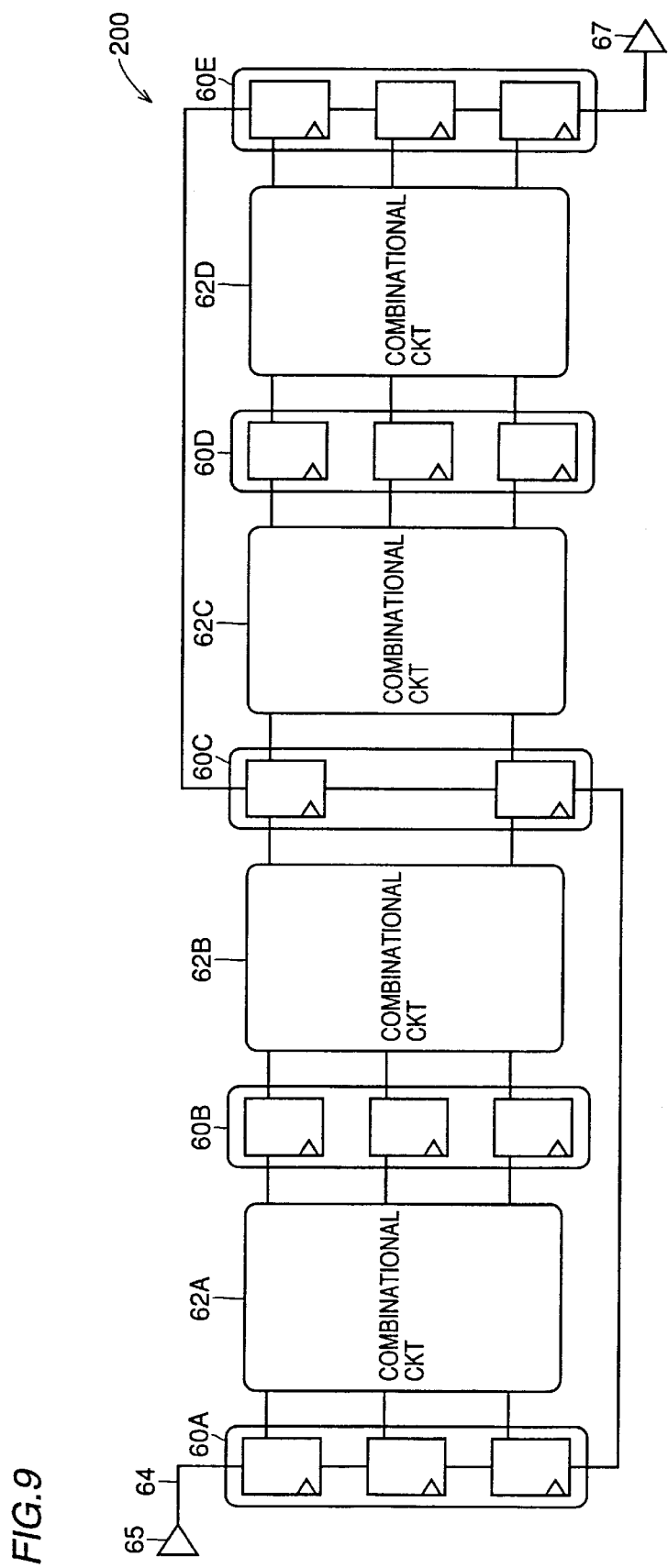
FIGS. 9 and 10 are circuit diagrams of pipeline circuits 200 and 202 according to the first embodiment, respectively.

Referring to FIG. 9, the extracted groups of FFs 60A, 60C and 60E are subjected to scan conversion, a scan chain 64 is constructed, and a pipeline circuit 200 is obtained (S4). A data base is constructed to provide ATPG processing for combinational circuits 62A–62D which configure pipeline circuit 200 (S6).

Figure 10:
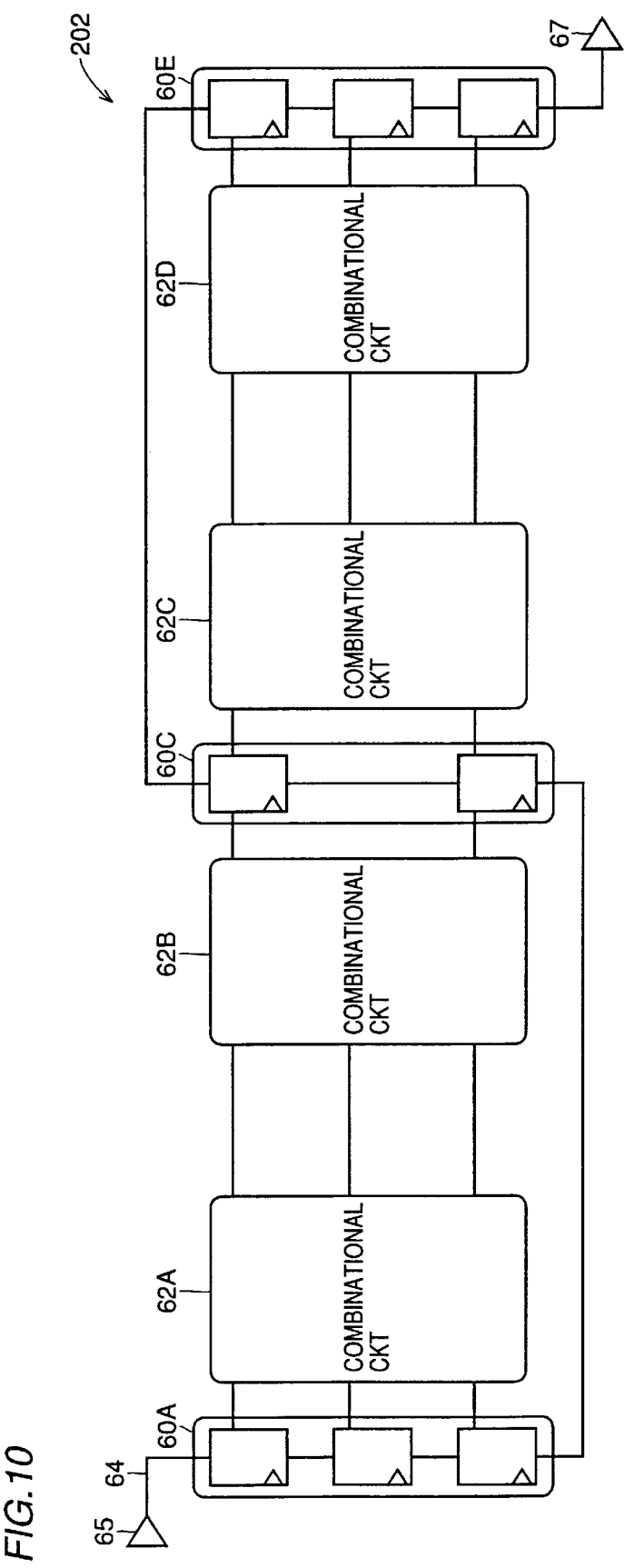
Figure 11:
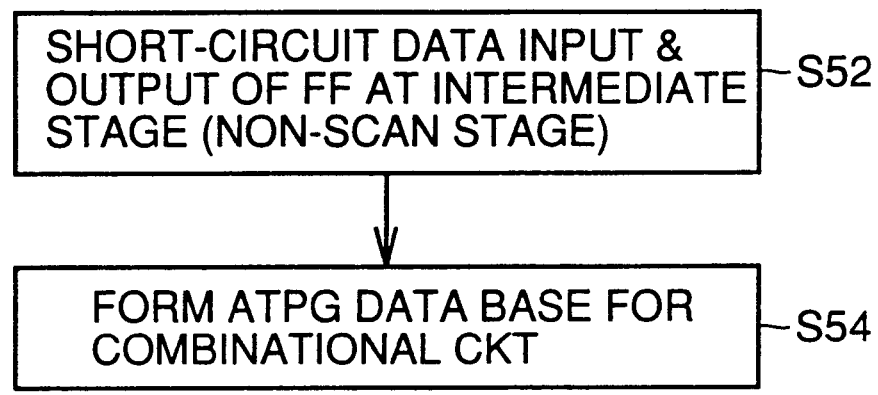
FIG. 11 is a flow chart of a processing for data base construction for ATPG according to the first embodiment.
Figure 12:
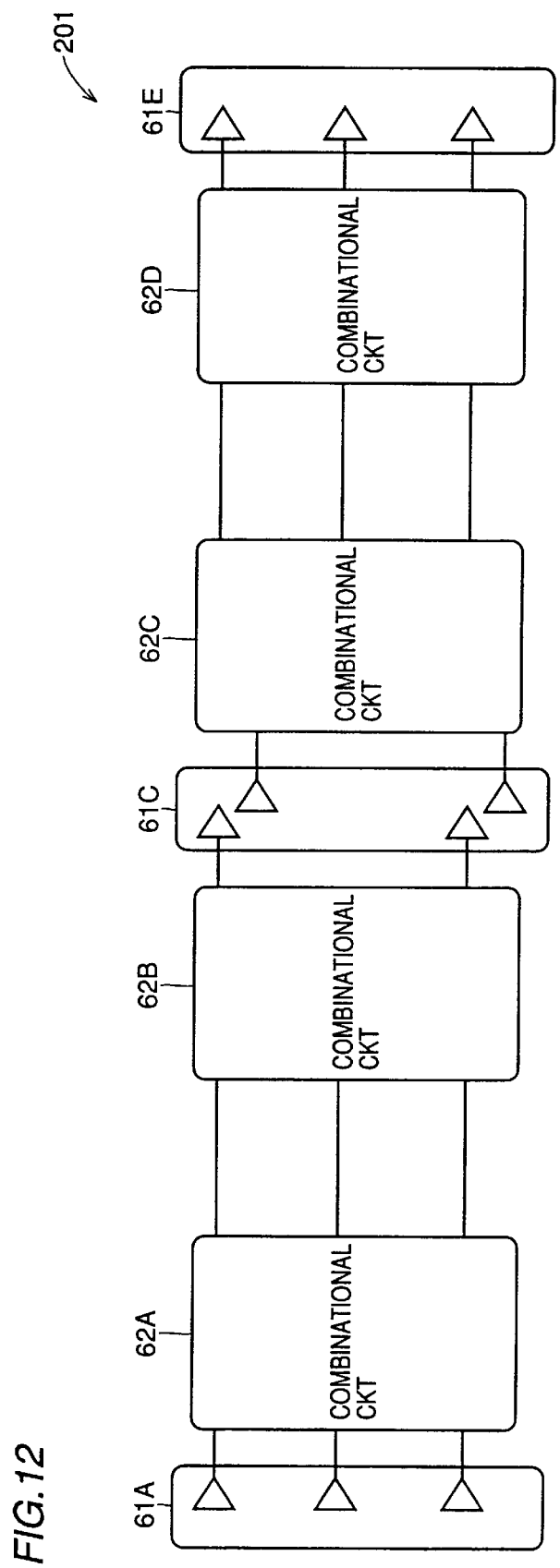
FIG. 12 is a circuit diagram showing a pipeline circuit 201 according to the first embodiment.

The processing at S6 will now be more specifically described with reference to FIGS. 10 and 11. The FFs belonging to each of the groups of FFs 60B and 60D belonging to intermediate stages (i.e. stages of the groups of FFs which have not been extracted in the processing at S2) are virtually eliminated and the data input signals and data output signals of the FFs are short-circuited to obtain a pipeline circuit 202 (S52). The FFs belonging to the groups of FFs 60A, 60C and 60E subjected to scan conversion are eliminated and input terminals and output terminals are inserted virtually (S54) to obtain a pipeline circuit 201 shown in FIG. 12.

Figure 5:
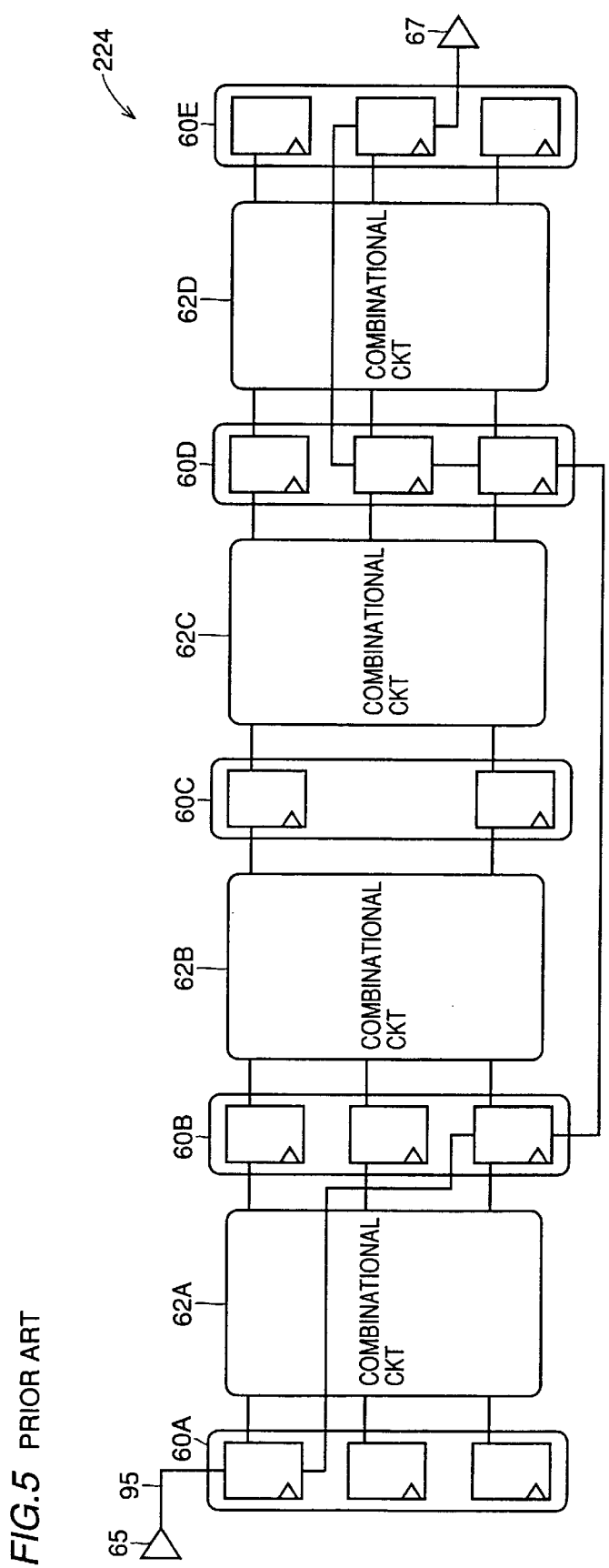
FIG. 5 is a circuit diagram of a conventional pipeline circuit 224.

Referring again to FIG. 8, pipeline circuit 201 can be subjected to a full scan ATPG processing as conventional. ATPG processing is performed for combinational circuits 62A–62D (S8), as in the processing at S34 described with reference to FIG. 5. A test pattern obtained at S8 is formatted to provide a test pattern for scan test (S10). It should be noted that in order for combinational circuit 62A and the group of FFs 60C to receive a value held in the group of FFs 60A and an output from combinational circuit 62B, respectively, a capture clock must be applied twice to pipeline circuit 200. Accordingly, the processing at S10 generates such a test pattern that the capture clock is applied twice.

Figure 13:
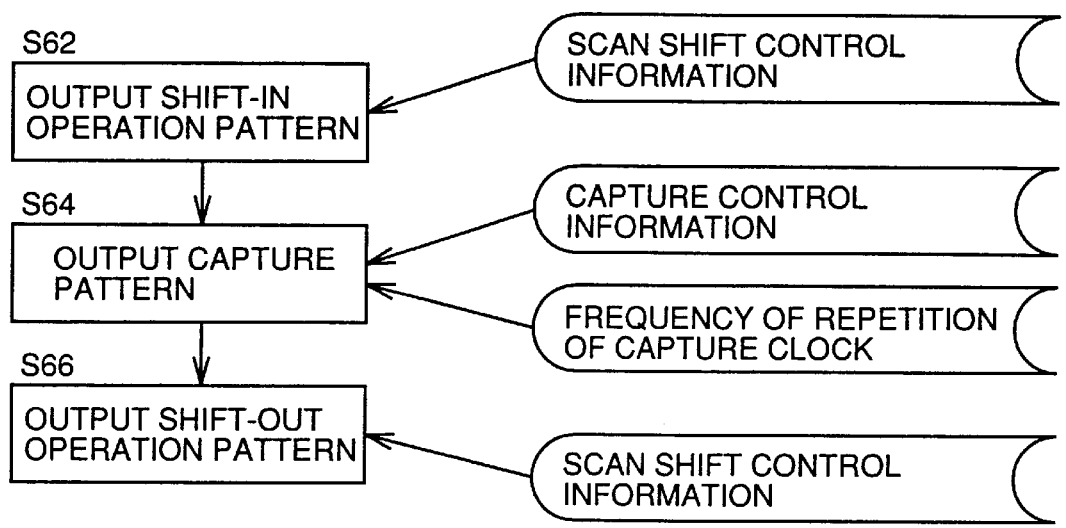
FIG. 13 is a flow chart a processing for formatting a test pattern according to the first embodiment.

The processing at S10 will now be more specifically described with reference to FIG. 13. A shift-in operation pattern is output (S62) based on scan shift control information, which is a setting of a pin required for shift operation and is formed at some times by the designer and at other times automatically by a Design Rule Check (DRC) program for checking whether scan design is provided accurately. Scan shift control information is combined with data to be shifted in a conventional circuit to output a shift-in operation pattern. The data of a pin which is not shifted in is set to DON'T CARE.

A capture pattern is output (S64) based on capture control information and the frequency of repetition of capture clock (i.e. the frequency at which the capture clock is applied). The capture control information describes a setting of a pin required in capturing data, and is formed by the designer at some times and automatically formed by a DRC program at other times. It should be noted that the capture pattern is repeatedly output at the frequency of repetition of capture clock, which is equal to the number n of stages subjected to scan conversion.

Data to be observed at a scan-out terminal is combined, as in outputting a shift-in operation pattern (S62), to output a shift-out operation pattern (S66). If there is another shift-in operation pattern to be output, the processing at S62 is performed in parallel with the processing at S66.

A test circuit thus configured allows full scan ATPG with addition of 1/n of a conventional circuit and can provide wide fault detection coverage, which is characteristic to full scan ATPG processing, with less test patterns, which also results in the capability to allow for circuits in large scale.

Second Embodiment

An automatic test pattern generating device for pipeline circuit according to a second embodiment of the present invention is identical in configuration to that according to the first embodiment described with reference to FIGS. 6 and 7, and a description of the configuration will thus not be repeated here.

Figure 14:
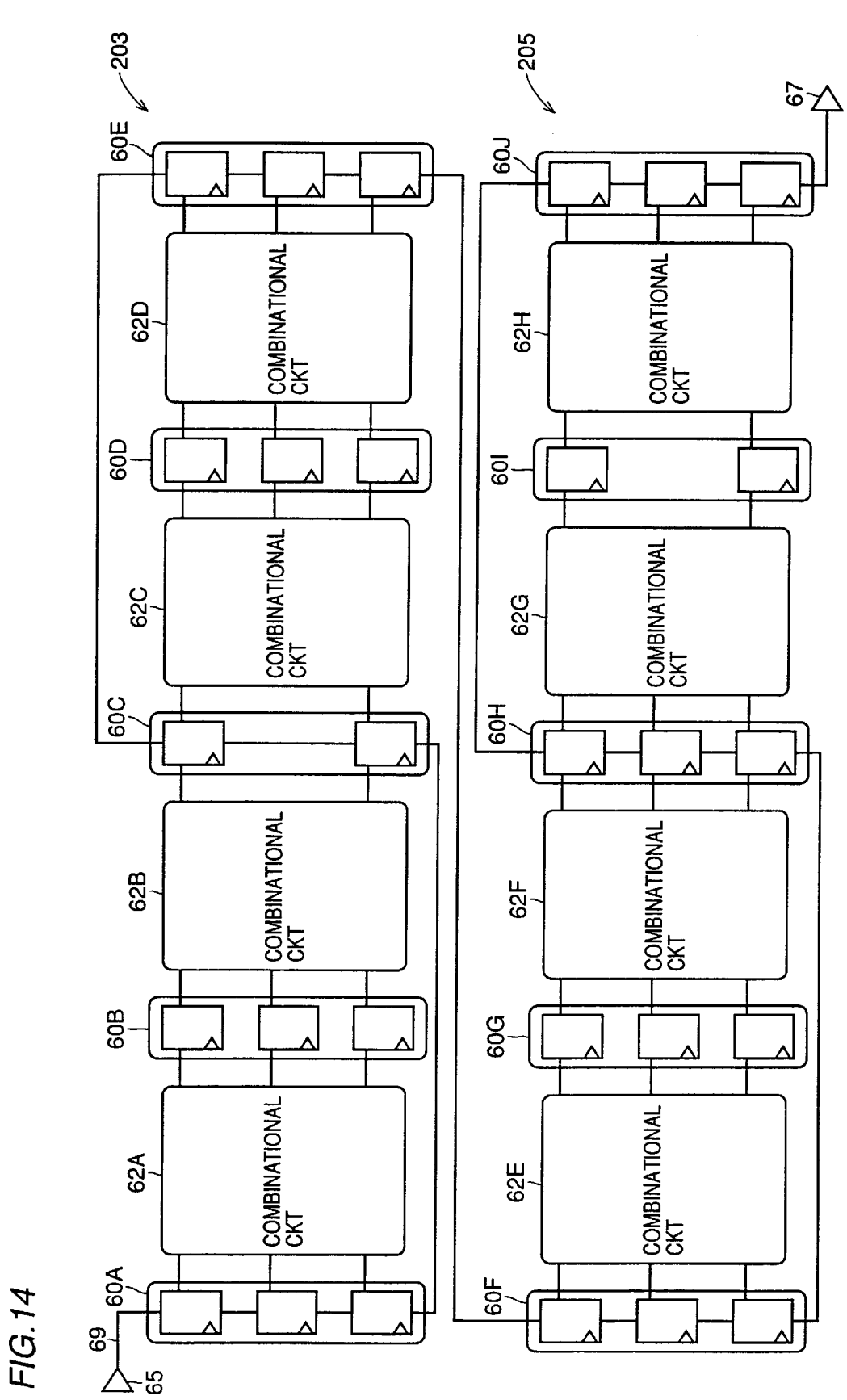
FIG. 14 is a circuit diagram showing pipeline circuits 203 and 205 according to a second embodiment.

Referring to FIG. 14, let us assume that different pipeline circuits 203 and 205 are provided in a same LSI. Pipeline circuit 203 includes groups of FFs 60A–60E and combinational circuits 62A–62D. Combinational circuit 62A receives a value held in the group of FFs 60A, performs a predetermined logical operation on the received value and then writes the operation result into the group of FFs 60B. Combinational circuit 62B receives a value held in the group of FFs 60B, performs a predetermined logical operation on the received value and then writes the operation result into the group of FFs 60C. Combinational circuit 62C receives a value held in the group of FFs 60C, performs a predetermined logical operation on the received value and then writes the operation result into the group of FFs 60D. Combinational circuit 62D receives a value held in the group of FFs 60D, performs a predetermined logical operation on the received value and then writes the operation result into the group of FFs 60E.

Pipeline circuit 205 includes groups of FFs 60F–60J and combinational circuits 62E–62H. Combinational circuit 62E receives a value held in the group of FFs 60F, performs a predetermined logical operation on the received value and then writes the operation result into the group of FFs 60G. Combinational circuit 62F receives a value held in the group of FFs 60G, performs a predetermined logical operation on the received value and then writes the operation result into the group of FFs 60H. Combinational circuit 62G receives a value held in the group of FFs 60H, performs a predetermined logical operation on the received value and then writes the operation result into the group of FFs 60I. Combinational circuit 62H receives a value held in the group of FFs 60I, performs a predetermined logical operation on the received value and then writes the operation result into the group of FFs 60J.

Pipeline circuits 203 and 205 can each have a group of FFs subjected to scan conversion for every two stages, as in the first embodiment, to construct a scan chain 69 to generate test pattern.

Third Embodiment

An automatic test pattern generating device for pipeline circuit according to a third embodiment of the present invention is identical in configuration to that according to the first embodiment described with reference to FIGS. 6 and 7 and a description of the configuration will thus not be repeated here.

Figure 15:
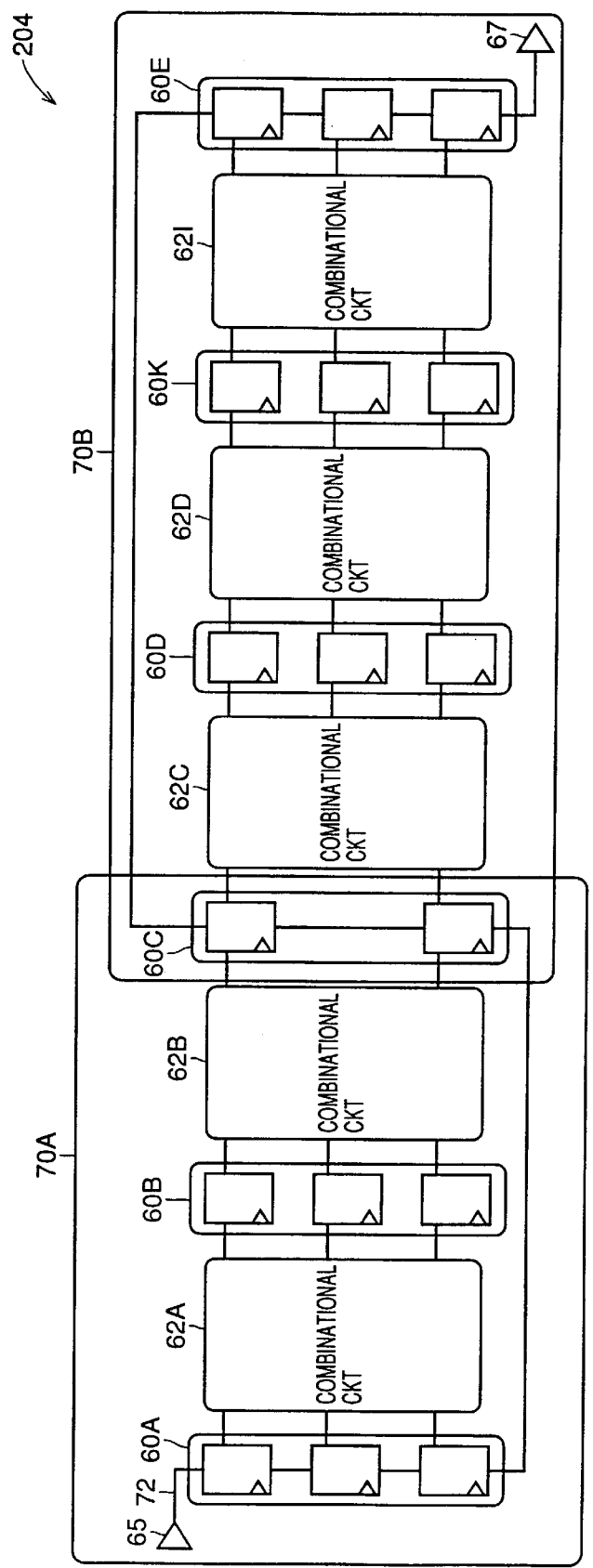
FIG. 15 is a circuit diagram showing a pipeline circuit 204 according to a third embodiment.

Referring to FIG. 15, a pipeline circuit 204 includes groups of FFs 60A–60E and 60K, and combinational circuits 62A–62D and 62I. Combinational circuit 62A receives a value held in the group of FFs 60A, performs a predetermined operation on the received value and writes the operation result into the group of FFs 60B. Combinational circuit 62B receives a value held in the group of FFs 60B, performs a predetermined operation on the received value and writes the operation result into the group of FFs 60C. Combinational circuit 62C receives a value held in the group of FFs 60C, performs a predetermined operation on the received value and writes the operation result into the group of FFs 60D. Combinational circuit 62D receives a value held in the group of FFs 60D, performs a predetermined operation on the received value and writes the operation result into the group of FFs 60K. Conventional circuit 62I receives a value held in the group of FFs 60K, performs a predetermined operation on the received value and writes the operation result into the group of FFs 60E. Let us assume that pipeline circuit 204 has the groups of FFs 60A, 60C and 60E each subjected to scan conversion to construct a scan chain 72. Pipeline circuit 204 is divided into a pipeline circuit 70A having a group of FFs subjected to scan conversion for every n1 stages and a pipeline circuit 70B having a group of FFs subjected to scan conversion for every n2 stages for test pattern generation. It should be noted that the value of n1 is different from that of n2.

Figure 16:
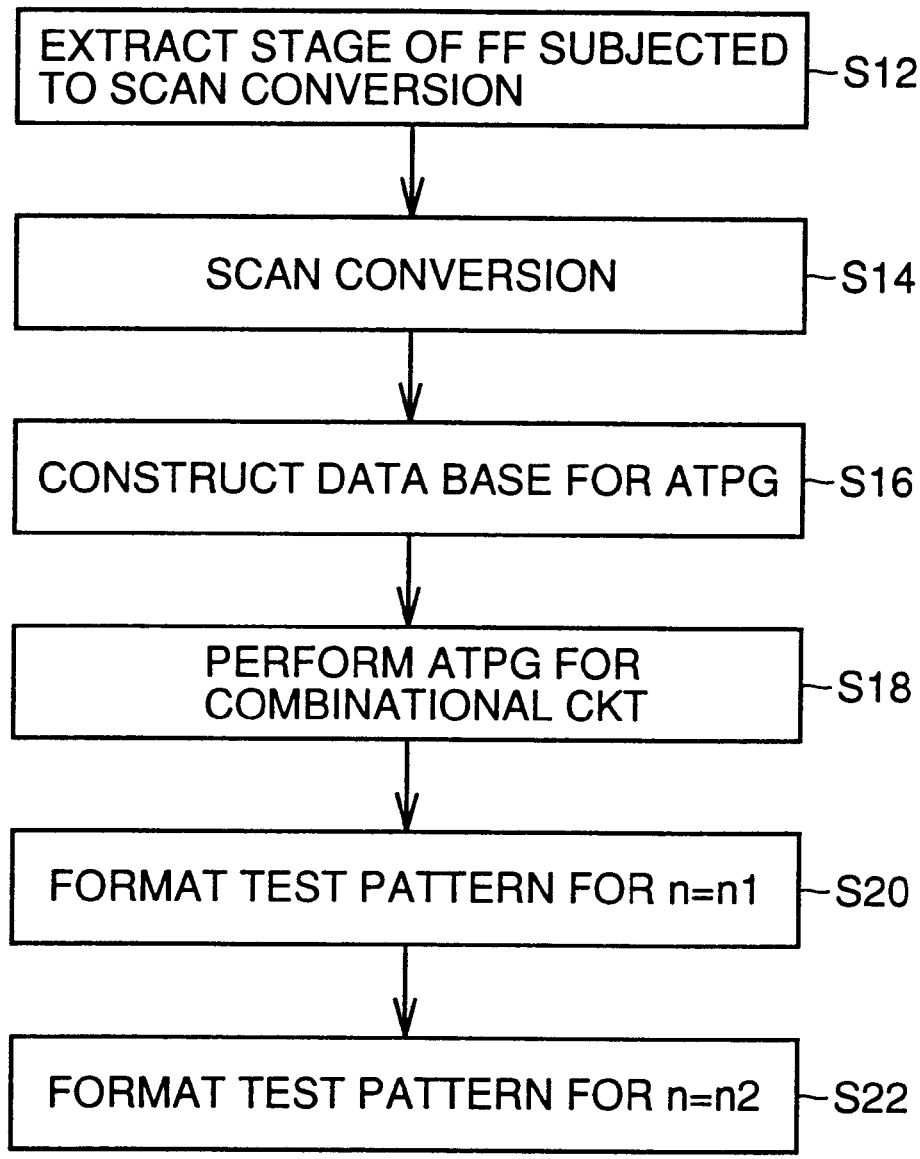
FIG. 16 is a flow chart of an operation of an automatic test pattern generating device according to the third embodiment.

Referring to FIG. 16, pipeline circuits 70A and 70B each have a group of FFs subjected to scan conversion that is extracted for every n1 stages and ever, n2 stages, respectively (S12). For example, for n1=2 and n2=3, the groups of FFs 60A and 60C are extracted from pipeline circuit 70A and the groups of FFs 60C and 60E are extracted from pipeline circuit 70B.

The extracted groups of FFs 60A, 60C and 60E are subjected to scan conversion to construct a scan chain 72 (S14). A data base is constructed which can provide ATPG processing for combinational circuits 62A–62D and 62I configuring the pipeline circuit 204 (S16). More specifically, a data base is constructed which allows data to pass through the groups of FFs 60B, 60D and 60K which are not subjected to scan conversion.

As in the processing at S8 described with reference to FIG. 8, ATPG processing is performed for combinational circuits 62A–62D and 62I (S18). As in the processing at S10, a test pattern for pipeline circuit 70A that is obtained at S18 is formatted to provide a test pattern for scan test (S20). Similarly, a test pattern for pipeline circuit 70B that is obtained at S18 is formatted to provide a test pattern for scan test (S22). For the scan test conducted for pipeline circuit 70A, pipeline circuit 204 must receive a capture clock twice. For the scan test conducted for pipeline circuit 70B, pipeline circuit 204 must receive a capture clock three times. Accordingly, test pattern formatting (S20, S22) is provided for each of pipeline circuit 70A with n1 stages subjected to scan conversion and pipeline circuit 70B with n2 stages subjected to scan conversion. Although this results in a long test pattern, it also provides the advantage as described below.

If the method described in the first embodiment is employed to provide test pattern generation for pipeline circuit 204 for the number of stages subjected to scan conversion n=2, the groups of FFs subjected to scan conversion will be three groups of FFs 60A, 60C and 60I. Consequently, there is not a group of FFS which can observe the output value of combinational circuit 62I, and a test pattern cannot be generated capable of verifying the operation of combinational circuit 60I. By contrast, the present method allows test pattern generation for all combinational circuits in such a situation.

Figure 3:
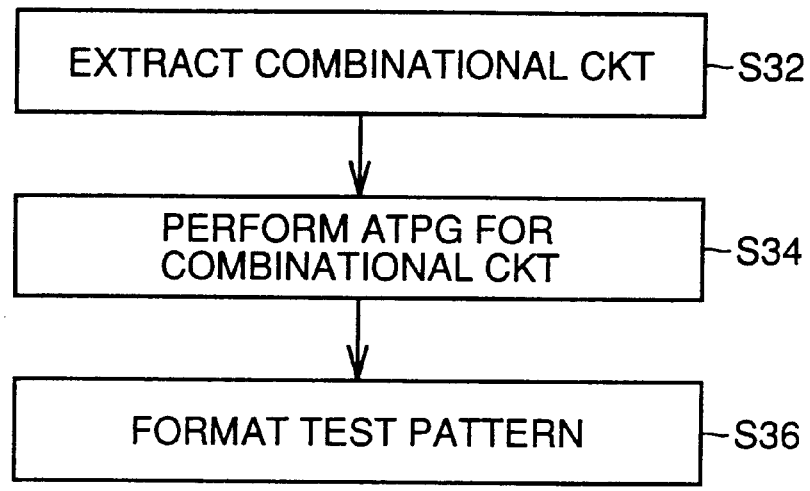
FIG. 3 is a flow chart of a conventional, full scan ATPG processing.
Figure 4:
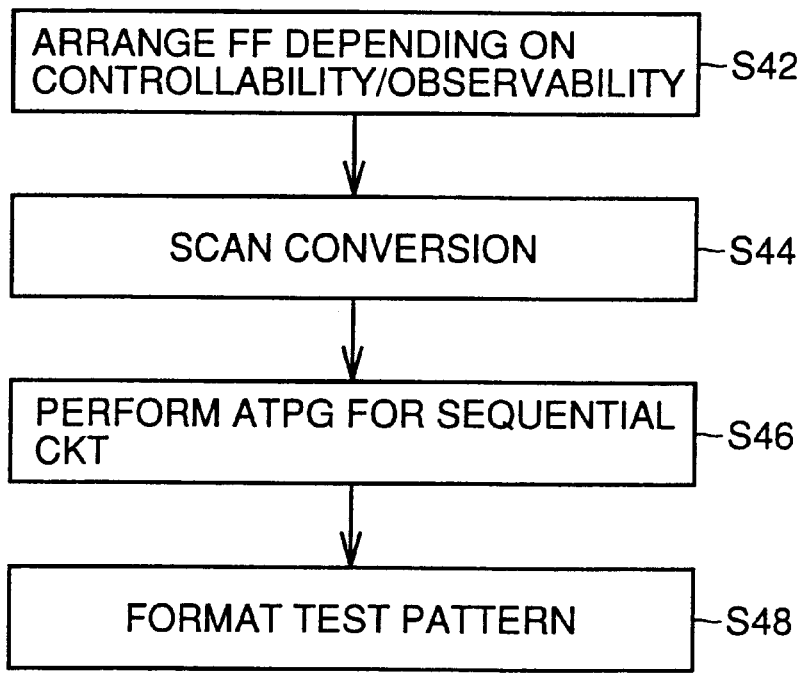
FIG. 4 is a flow chart of a conventional, partial scan ATPG processing.
Figure 17:
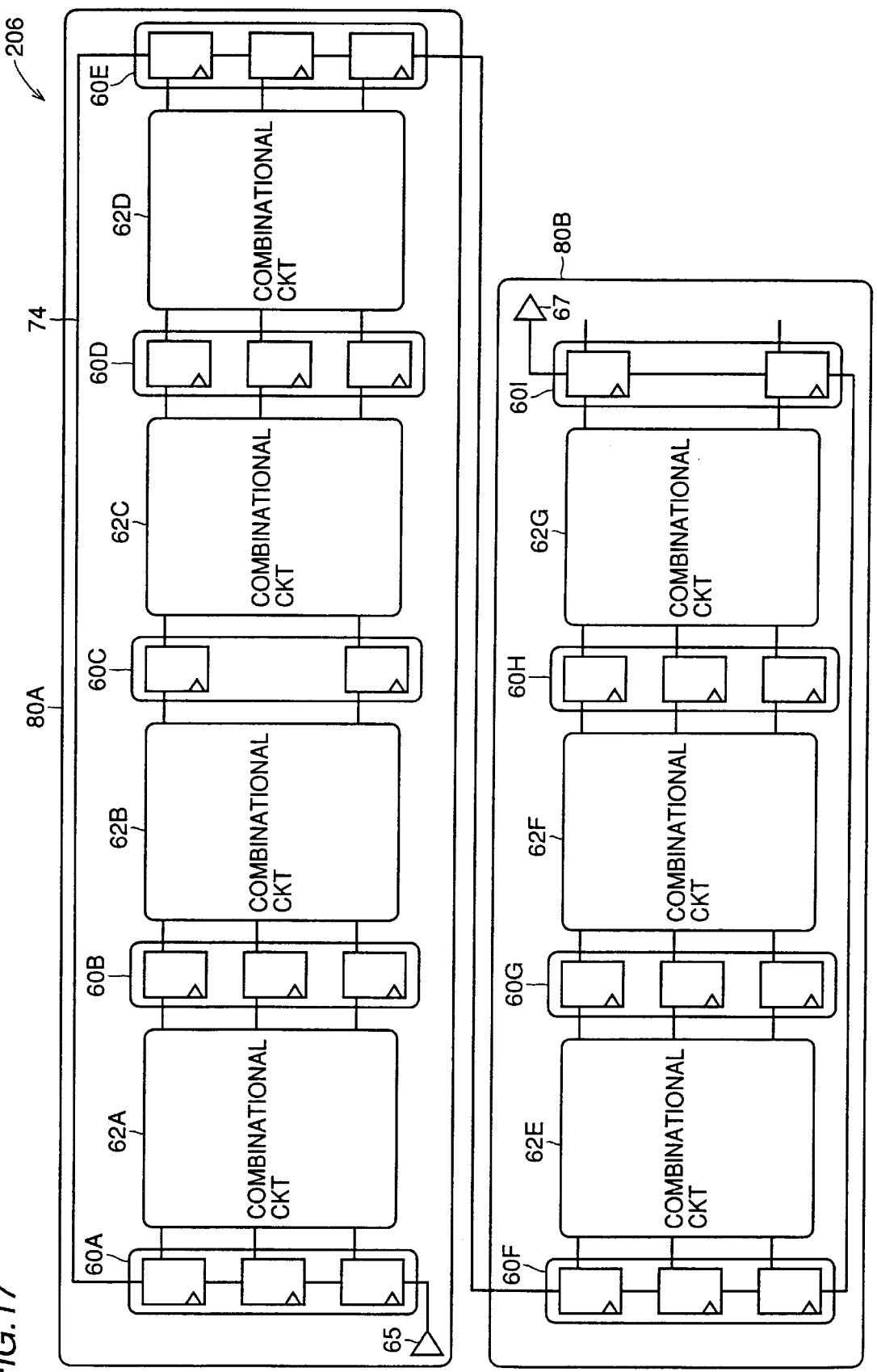
FIG. 17 is a circuit diagram showing a group of pipeline circuits 206 according to the third embodiment.

Referring to FIG. 17, a group of pipeline circuits 206 includes pipeline circuits 80A and 80B. Pipeline circuit 80A includes groups of FFs 60A–60E: and combinational circuits 62A–62D. The connection thereof is similar to that of pipeline circuit 220 described with reference to FIG. 3 and a description thereof will thus not be repeated. Pipeline circuit 80B includes groups of FFs 60F–60I and combinational circuits 62E–62G. Combinational circuit 62E receives a value held in the group of FFs 60F, performs a predetermined logical operation on the received value and writes the operation result into the group of FFs 60G. Combinational circuit 62F receives a value held in the group of FFs 60G, performs a predetermined logical operation on the received value and writes the operational result into the group of FFs 60H. Combinational circuit 62G receives a value held in the group of FFs 60H, performs a predetermined logical operation on the received value and then writes the operation result into the group of FFs 60I.

The number of stages subjected to scan conversion is determined for each of pipeline circuits 80A and 80B such that the group of FFs at the first stage and the group of FFs at the last stage are subjected to scan conversion. The numbers n1 and n2 of stages subjected to scan conversion are four and three for pipeline circuits 80A and 80B, respectively. Then, test pattern generation is provided, as in the method described above. Since the groups of FFs at the first and last stages of each pipeline circuit are subjected to scan conversion, full scan ATPG can be performed with the minimum addition of the circuit and test pattern generation can be provided for all combinational circuits.

Fourth Embodiment

An automatic test pattern generating device for pipeline circuit according to a fourth embodiment of the present invention is identical in configuration to that according to the first embodiment described with reference to FIGS. 6 and 7, and a description of the configuration will thus not be repeated here.

Figure 18:
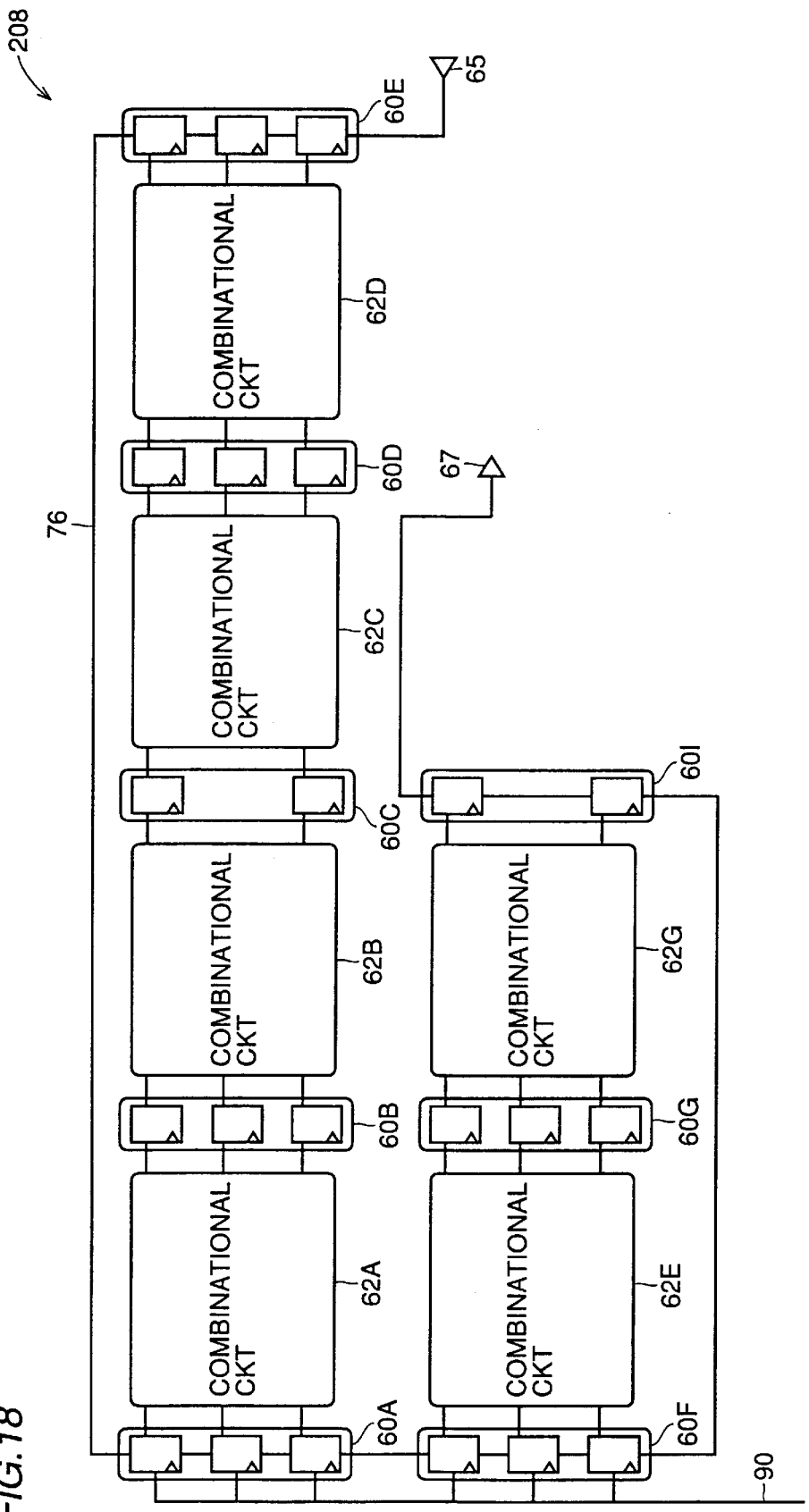
FIG. 18 is a circuit diagram showing a group of pipeline circuits 208 according to a fourth embodiment.

FIG. 18 shows a group of pipeline circuits 208 including two different pipeline circuits. A first pipeline circuit included in the group of pipeline circuits 208 includes groups of FFs 60A–60E and combinational circuits 62A–62D. The connection thereof is similar to that in pipeline circuit 220 described with reference to FIG. 3 and a description thereof will not be repeated. A second pipeline circuit included in the group of pipeline circuits 208 includes groups of FFs 60F, 60G and 60I, and combinational circuits 62E and 62G. Combinational circuit 62E receives a value held in the group of FFs 60F, performs a predetermined logical operation on the received value and then writes the operation result into the group of FFs 60G. Combinational circuit 62G receives a value held in the group of FFs 60G, performs a predetermined logical operation on the received value and then writes the operational result into the group of FFs 60I.

A test pattern generating method in the present embodiment is similar to that in the first embodiment described with reference to FIG. 8. The group of FFs at the first stage and the group of FFs at the last stage are extracted from each of the two pipeline circuits (S2). The groups of FFs 60A and 60E are extracted from the first pipeline and the groups of FFs 60F and 60I are extracted from the second pipeline circuit.

Figure 19:
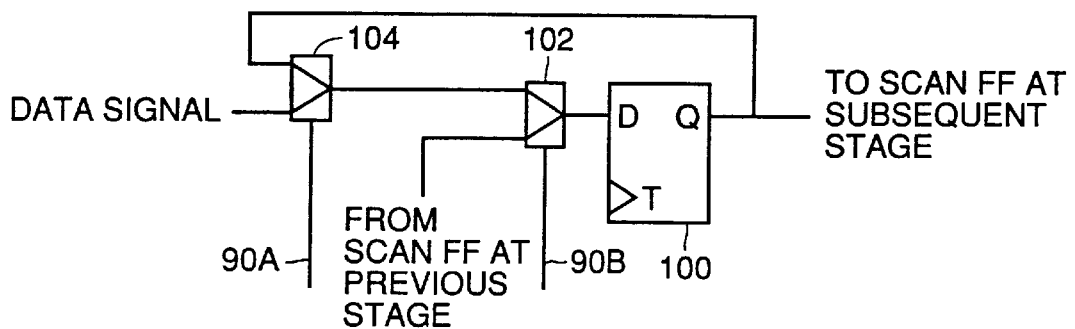
FIG. 19 is a circuit diagram showing a scan FF with data holding function according to the fourth embodiment.

The groups of FFs extracted at S2 are subjected to scan conversion to construct a scan chain 76 (S4). It should be noted that the FFs included in the groups of FFs 60A and 60F at their respective first stages are each converted into a scan FF with data holding function. Referring to FIG. 19, the scan FF with data holding function includes: a FF 100; a selector 104 which receives a value held in FF 100 and a data signal from an internal system, and outputs one of them in response to a data hold signal 90A; and a selector 102 which receives an output of selector 104 and an output of FF 100 included in a scan FF at the previous stage, and outputs one of them in response to a scan enable signal 90B. FF 100 receives, holds and provides an output of selector 102 to one input of selector 104 and to one input of selector 102 included in a scan FF at the subsequent stage.

A data base is constructed to allow ATPG processing for such combinational circuits that data is passed through the groups of FFs 60B–60D and 60G not subjected to scan conversion (S6).

A full scan ATPG processing as conventional is applied to each of the first and second pipeline circuits (S8). A test pattern obtained at S8 is formatted to provide a test pattern for scan test (S10), as follows. The maximum number of stages max_n of the pipeline circuits is obtained from the group of pipeline circuits 208. In this example, max_n equals five. A test pattern is generated to apply a capture clock to the group of pipeline circuits 208 (max_n-1) times. It should be noted that in applying the capture clock, the values of data hold signal 90A and scan enable signal 90B are set so that selectors 104 and 102 select the output of FF 100 and the output of selector 104, respectively.

By holding the data of scan FFs while the capture clock is applied (max_n-1) times, pipeline circuits different in the number of stages can be tested simultaneously and it is thus not necessary to form a test pattern for each pipeline. Accordingly, the file size of a test pattern can also be reduced.

Figure 20:
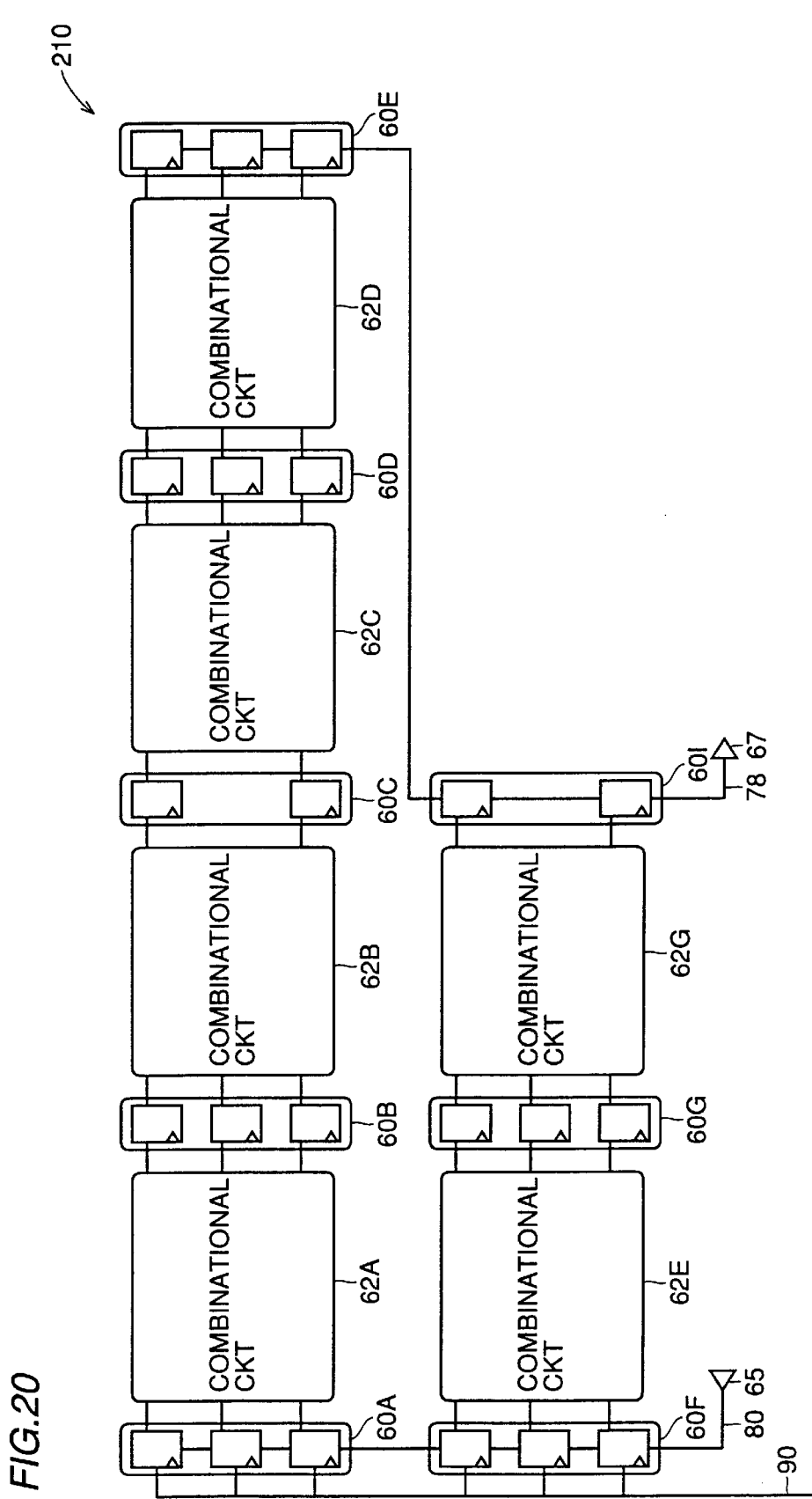
FIGS. 20 and 21 are circuit diagrams showing groups of pipeline circuits 210 and 212 according to the fourth embodiment, respectively.

For the group of pipeline circuits 208 shown in FIG. 18, scan chain 76 is constructed to connect the group of FFs at the first stage of a pipeline circuit and that of FFs at the last stage of the pipeline circuit together. For the group of pipeline circuits 208, the length of scan chain 76 is increased as the value of max_n is increased, resulting in difficulty in interconnection. Accordingly, the scan chain may be divided, as in a group of pipeline circuits 210 shown in FIG. 20, into a scan chain 80 connecting the groups of FFs 60A and 60F at their respective first stages together and dedicated for inputting, and a scan chain 78 connecting the groups of FFs 60E and 60I at their respective last stages and dedicated for outputting. The group of pipeline circuits 210 can provide a scan chain of a fixed length independently of the value of max_n and facilitate interconnection.

Figure 21:
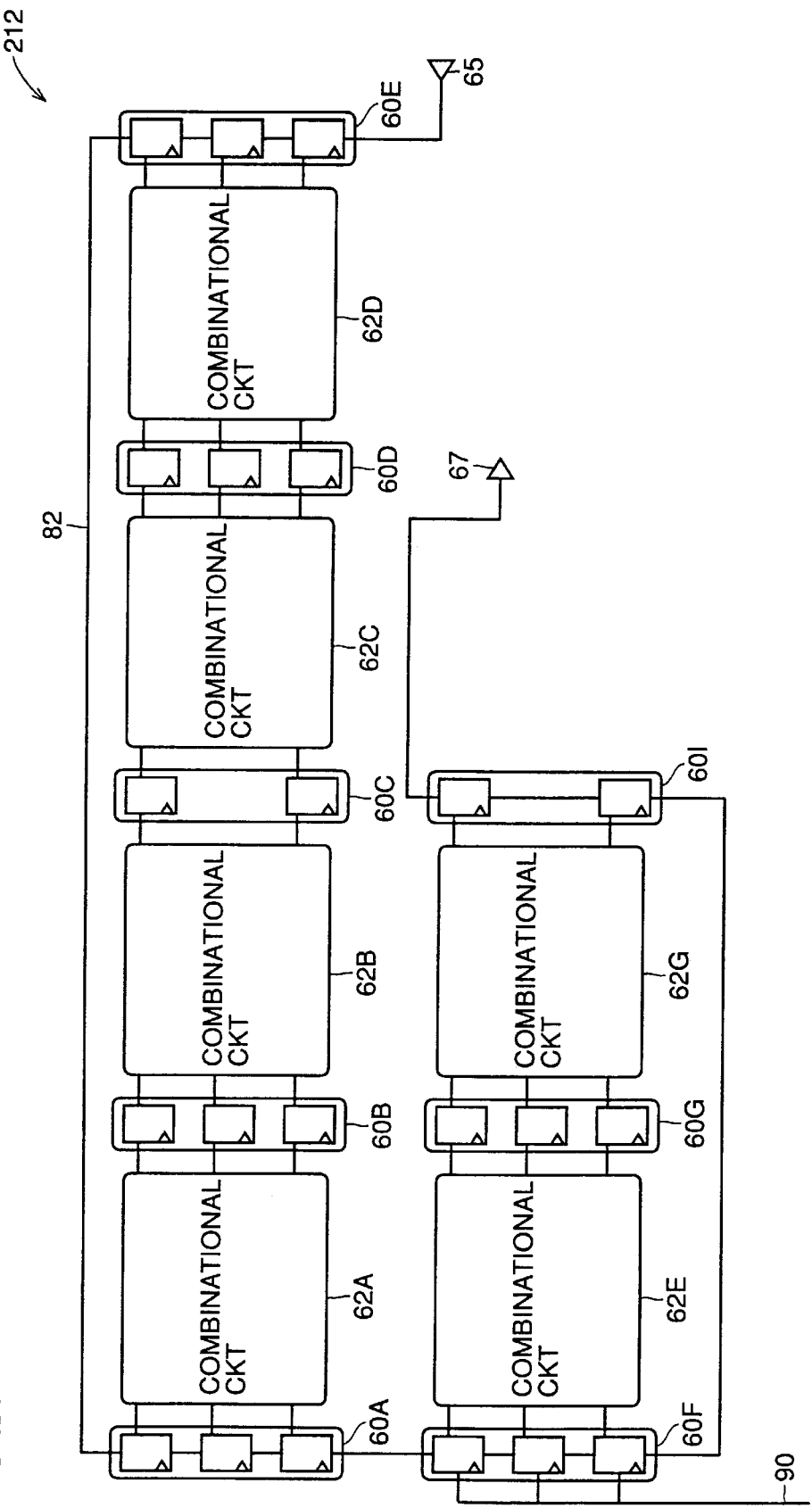

In a group of pipeline circuits 212 shown in FIG. 21, the group of FFs 60A at the first stage of a pipeline circuit with the largest number of stages may be converted into a normal scan FF without data holding function. Even with such conversion, a value after passing through combinational circuits 62A–62D for which value a value set for the group of FFs 60A serves as an input is set for the group of FFs 60E after a capture clock is applied max_n times. The group of pipeline circuits 212 can minimize the number of scan FFs with data holding function and hence addition of the circuit to the pipeline circuit.

Fifth Embodiment

An automatic test pattern generating device for pipeline circuit according to a fifth embodiment of the present invention is identical in configuration to that according to the first embodiment described with reference to FIGS. 6 and 7, and a description of the configuration will not be repeated here.

Figure 22:
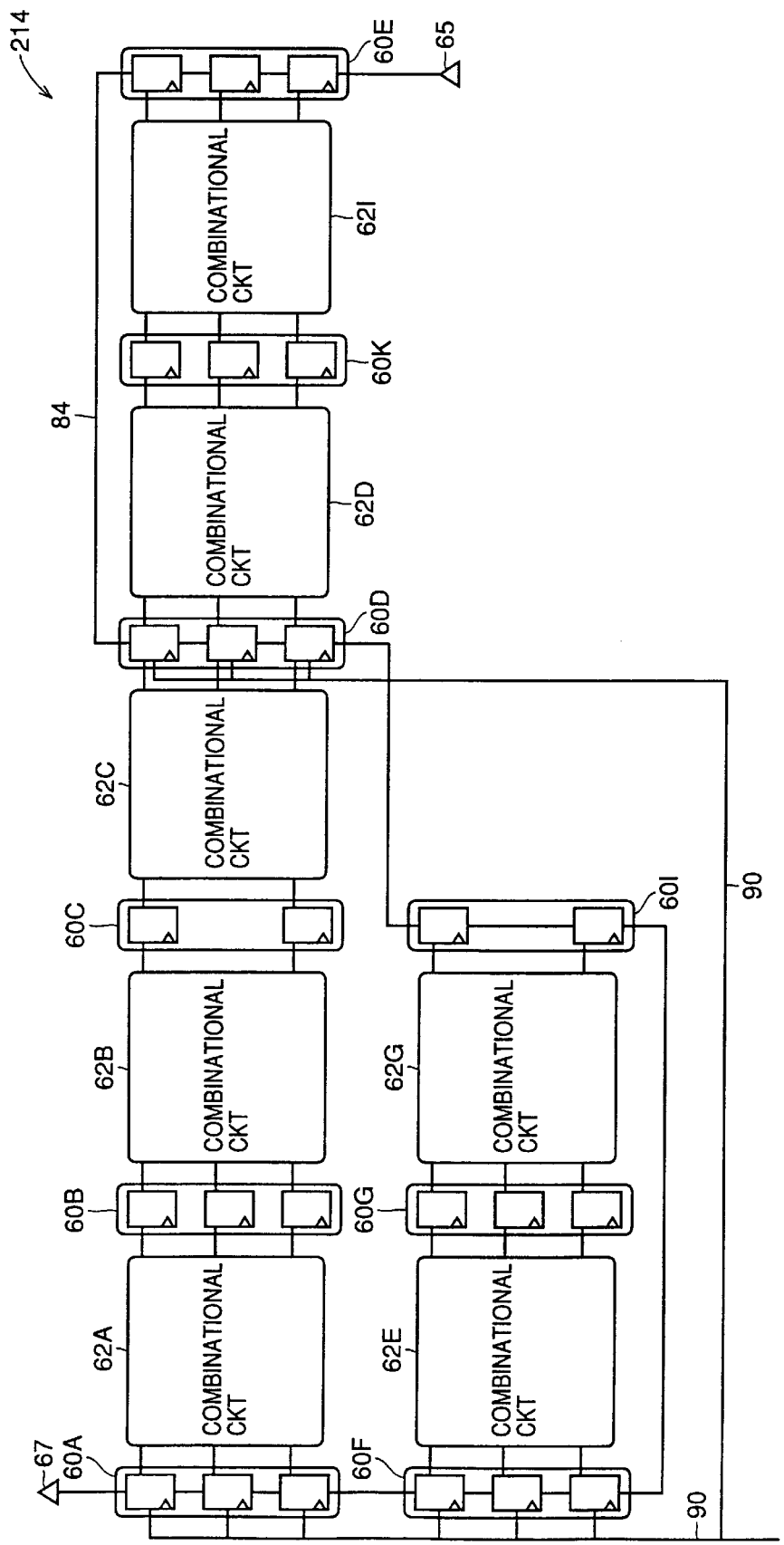
FIGS. 22 and 23 are circuit diagrams showing groups of pipeline circuits 214 and 216 according to fifth and sixth embodiments, respectively.

FIG. 22 shows a group of pipeline circuits 214 including two different pipeline circuits. A first pipeline circuit included in the group of pipeline circuits 214 includes groups of FFs 60A–60E and 60K, and combinational circuits 62A–62D and 62I. Combinational circuit 62A receives a value held in the group of FFs 60A, performs a predetermined logical operation on the received value and then writes the operation result into the group of FFs 60B. Combinational circuit 62B receives a value held in the group of FFs 60B, performs a predetermined logical operation on the received value and then writes the operation result into the group of FFs. 60C. Combinational circuit 62C receives a value held in the group of FFs 60C, performs a predetermined logical operation on the received value and then writes the operation result into the group of FFs 60D. Combinational circuit 62D receives a value held in the group of FFs 60D, performs a predetermined logical operation on the received value and then writes the operation result into the group of FFs 60K. Combinational circuit 62I receives a value held in the group of FFs 60K, performs a predetermined logical operation on the received value and then writes the operation result into the group of FFs 60E.

A second pipeline circuit included in the group of pipeline circuits 214 includes groups of FFs 60F–60I and combinational circuits 62E and 62G. The connection thereof is similar to that in the second pipeline circuit included in the group of pipeline circuits 208 described with reference to FIG. 18, and a description thereof will thus not be repeated here.

A test pattern generating method in the present embodiment is similar to that in the first embodiment described with reference to FIG. 8. The group of FFs at the first stage and the group of FFs at the last stage are extracted from each of the two pipeline circuits (the groups of FFs 60A, 60E, 60F and 60I in FIG. 22). If any of pipeline circuits has its number of stages exceeding a predetermined number of stages (max_s), a group of FFs is extracted for every predetermined number of stages (S2 in FIG. 8). In FIG. 22, max_s is equal to three and the group of FFs 60D is thus extracted.

The group of FFs extracted at S2 is subjected to scan conversion to construct a scan chain 84 (S4). It should be noted that the groups of FFs 60A and 60F at their respective first stages and the group of FFs 60D are each converted into a scan FF with data holding function.

A data base is constructed to allow ATPG processing for such combinational circuits that data is passed through the groups of FFs 60B, 60C, 60K and 60G not subjected to scan conversion (S6).

Full scan ATPG processing as conventional is applied to each of the first and second pipeline circuits (S8). A test pattern obtained at S8 is formatted to provide a test pattern for scan test (S10), as follows. A capture clock is applied to the group of pipeline circuits 214 max_s times. The groups of FFs 60A, 60D and 60F are set to hold data when the first (max_s−1) capture clocks are applied and to avoid holding data when the last capture clock is applied, since the group of FFs 60D receives and holds the output of combinational circuit 62C when the last capture clock is applied. In the above description, data is not held only for application of the last capture clock. In practice, as shown in Table 1, data must not be held for application of the last capture clock, although data may or may not be held for application of the ((max_s−min_s)+1)th to (max_s−1)th capture clocks. In addition, data must be held for application of the first to (max_s−min_s)th capture clocks.

TABLE 1

| CLOCK | DATA HOLDING |
|---|---|
| 1 to (max_s − min_s) | HELD |
| ((max_s − min_s) + 1) to (max_s − 1) | HELD OR NOT HELD |
| max_s | NOT HELD |

"Min_s" represents the minimum value of the spacing between the groups of FFs subjected to scan conversion that configure the group of pipeline circuits 214. For example, the min_s for the group of pipeline circuits 214 represents the spacing between the groups of FFs 60D and 60E (or the spacing between the groups of FFs 60F and 60I), i.e. two.

It should be noted that the group of pipeline circuits 214 may have the group of FFs 60A converted into a normal scan FF without data holding function, as in the fourth embodiment.

If the automatic test pattern generating device described in the fourth embodiment is employed to generate a test pattern for the group of pipeline circuits 214, there is no group of FFs between the groups of FFs 60A and 60E that is subjected to scan conversion and the scale of combinational circuits therebetween is thus increased, which makes it difficult to provide the ATPG processing in the processing at S8. By contrast, the automatic test pattern generating device according to the present embodiment allows the number of combinational circuits between the groups of FFS subjected to scan conversion to be limited to a predetermined number even when the number of stages in a pipeline circuit is significantly increased. Thus, such a problem as described above can be avoided and test pattern generation is ensured.

Sixth Embodiment

An automatic test pattern generating device for pipeline circuit according to a sixth embodiment of the present invention is identical in configuration to that according to the first embodiment described with reference to FIGS. 6 and 7, and a description of the configuration will not be repeated here.

Figure 23:
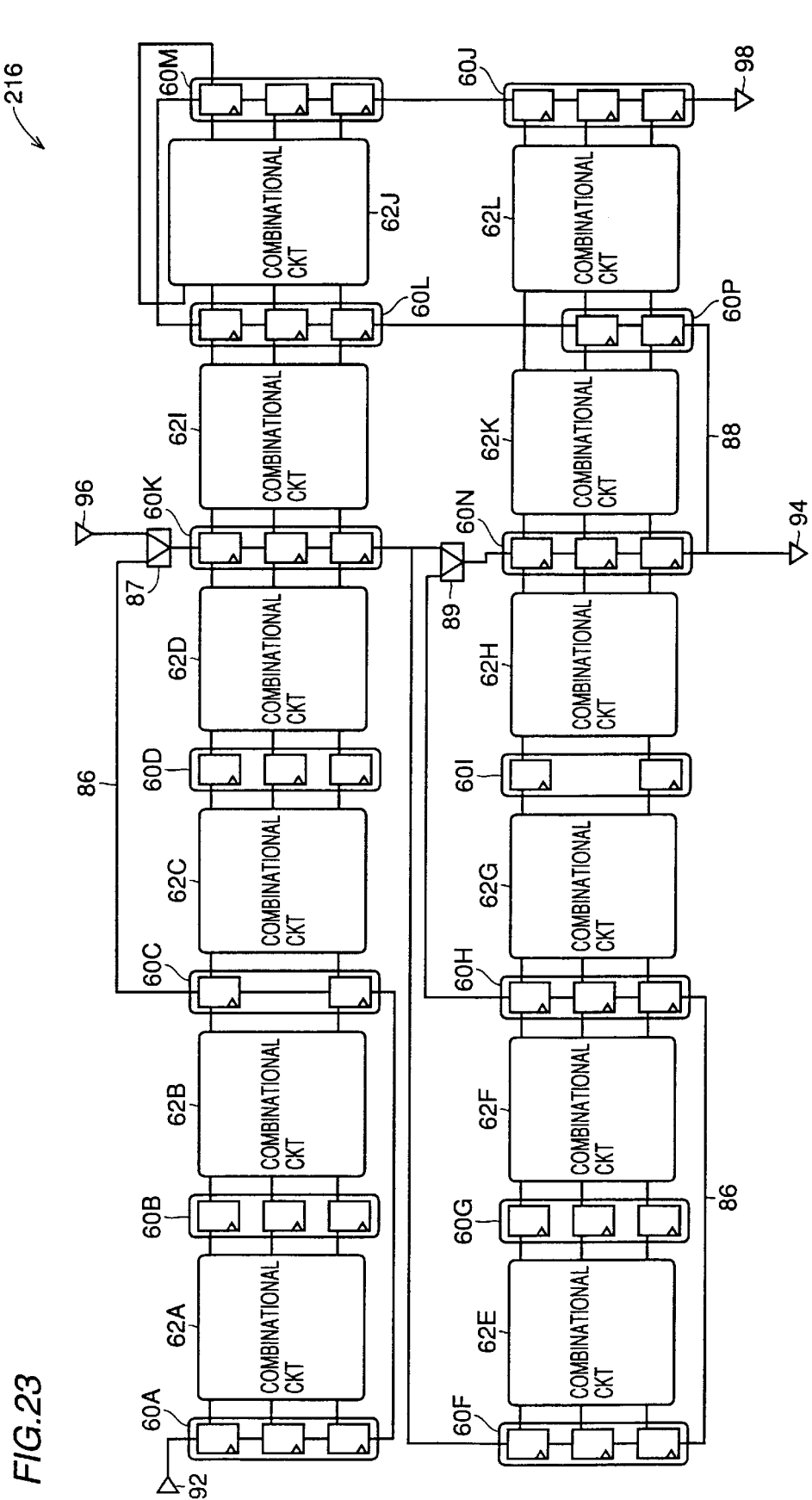

FIG. 23 shows a group of circuits 216 including two different circuits. A first circuit included in the group of circuits 216 includes groups of FFs 60A–60D and 60K–60M, and combinational circuits 62A–62D and 62I–62J. Combinational circuit 62A receives a value held in the group of FFs 60A, performs a predetermined logical operation on the received value and then writes the operation result into the group of FFs 60B Combinational circuit 62B receives a value held in the group of FFs 60B, performs a predetermined logical operation on the received value and then writes the operation result into the group of FFs 60C. Combinational circuit 62C receives a value held in the group of FFs 60C, performs a predetermined logical operation on the received value and then writes the operation result into the group of FFs 60D. Combinational circuit 62D receives a value held in the group of FFs 60D, performs a predetermined logical operation on the received value and then writes the operation result into the group of FFs 60K. Combinational circuit 62I receives a value held in the group of FFs 60K, performs a predetermined logical operation on the received value and then writes the operation result into the group of FFs 60L. Combinational circuit 62J receives a value held in the group of FFs 60L and a value held in a FF included in the group of FFs 60M, performs a predetermined logical operation and then writes an operation result into the group of FFs 60M.

A second circuit included in the group of circuits 216 includes groups of FFs 60F–60J, 60N and 60P, and combinational circuits 62E–62H, 62K and 62L. Combinational circuit 62E receives a value held in the group of FFs 60F, performs a predetermined logical operation on the received value and then writes the operation result into the group of FFs 60G. Combinational circuit 62F receives a value held in the group of FFs 60G, performs a predetermined logical operation on the received value and then writes the operation result into the group of FFs 60H. Combinational circuit 62G receives a value held in the group of FFs 60H, performs a predetermined logical operation on the received value and then writes the operation result into the group of FFs 60I. Combinational circuit 62H receives a value held in the group of FFs 60I, performs a predetermined logical operation on the received value and then writes the operation result into the group of FFs 60N. Combinational circuit 62K receives a value held in the group of FFs 60N, performs a predetermined logical operation on the received value and then transmits a portion of the operation result to combinational circuit 62L and writes the remaining portion of the operation result into the group of FFs 60P. Combinational circuit 62L receives a value held in the group of FFs 60P and a portion of an output of combinational circuit 62K, performs a predetermined operation and then writes an operation result into the group of FFS 60J.

Figure 24:
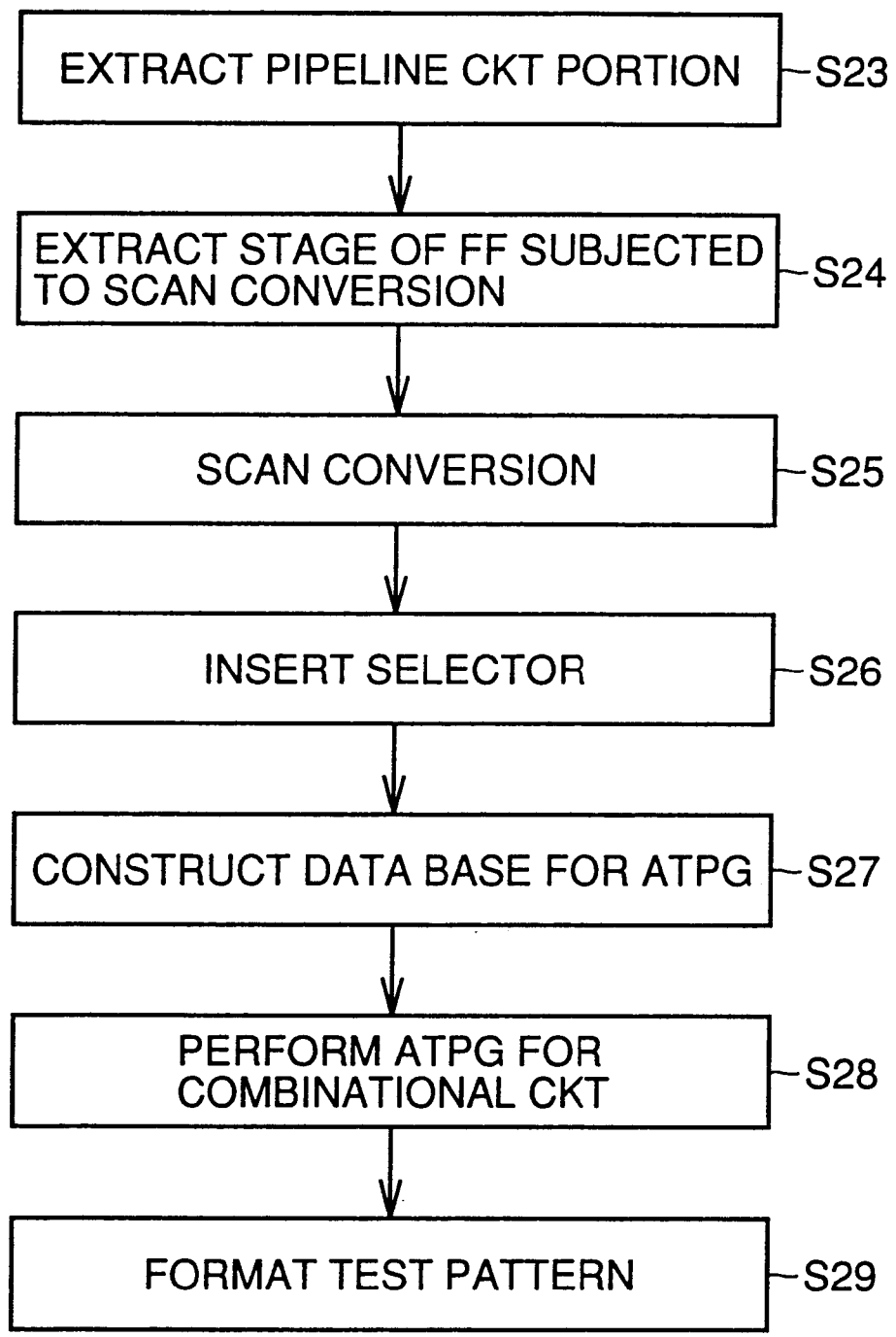
FIG. 24 is a flow chart of an operation of an automatic test pattern generating device according to the sixth embodiment.

A test pattern generating method according to the present embodiment will now be described with reference to FIG. 24. A pipeline circuit portion is extracted from each of the first and second circuits (S23). The pipeline circuit portion is a circuit portion which is interposed between the i-th searched group of FFs and the (i+1)th searched group of FFs of each circuit when the groups of FFs of each circuits are numbered for every m stages (two stages in FIG. 23), wherein data flows in one direction and there is no skip nor feedback of groups of FFs in interconnection. The group of circuits 21(; has the circuit portion interposed between the groups of FFs 60A and 60K and the circuit portion interposed between the groups of FFs 60F and 60N corresponding to pipeline circuit portions.

Extracted from the pipeline circuit portions are the groups of FFs subjected to scan conversion for every m stages (the groups of FFs 60A, 60C, 60K, 60F, 60H and 60N). From the circuit portion excluding the pipeline circuit portions, all groups of FFs are extracted (the groups of FFs 60L, 60M, 60P and 60J) (S24).

The extracted groups of FFs are subjected to scan conversion to construct a scan chain (S25). The scan chain is configured of a scan chain 86 connecting the groups of FFs in the pipeline circuit portions (i.e. the groups of FFs 60A, 60C, 60K, 60F, 60H and 60N) together and a scan chain 88 connecting the groups of FFs excluded from the pipeline circuit portions (i.e. the groups of FFs 60L, 60M, 60P and 60J) and the groups of FFs at their respect last stages in their respective pipeline circuit portions (i.e. the groups of FFs 60K and 60N) together. Scan chain 86 is constructed to transmit data from a scan-in terminal 92 through the groups of FFs 60A, 60C, 60K, 60F, 60H and 60N to a scan-output terminal 94. Scan chain 88 is constructed to transmit data from a scan-in terminal 96 through the groups of FFs 60K, 60N, 60P, 60L, 60M and 60J to a scan-out terminal 98.

Selectors 87 and 88 are inserted into the group of circuits 216 subjected to scan conversion (S26). Selector 87 receives a value of each of scan chains 86 and 88, and provides one value of them to the group of FFs 60K in response to a first select signal (not shown). Selector 89 receives a value of each of scan chains 86 and 88, and provides one value of them to the group of FFs 60N in response to a second select signal (not shown).

A data base is constructed capable of performing ATPG processing for combinational circuits 62A–62L (S27). More specifically, a data base is constructed, considering such combinational circuits that data is passed through the groups of FFs 60B, 60D, 60G and 60I not subjected to scan conversion.

After the data base is constructed, full scan ATPG processing is applied as conventional (S28). A test pattern obtained at S28 is formatted to provide a test pattern for scan test (S29). In scan test conducted for the pipeline circuit portions, the first and second select signals are set to allow each of selectors 87 and 89 to select the signal value of scan chain 86. In scan test conducted for the circuit portion excluding the pipeline circuit portions, the first and second select signals are set to allow each of selectors 87 and 89 to select the signal value of scan chain 88. Capture clock is applied twice in scan test conducted for the pipeline circuit portions and once in scan test conducted for the circuit portion excluding the pipeline circuit portions.

With such test pattern generation, a full scan ATPG processing can be performed with reduced addition of the circuit for a pipeline circuit portion, and a full scan ATPG processing can be performed conventionally for a circuit portion excluding the pipeline circuit portion. Thus, a test can be conducted which employs a test pattern small in file size and provides wide fault detection coverage.

Figure 25:
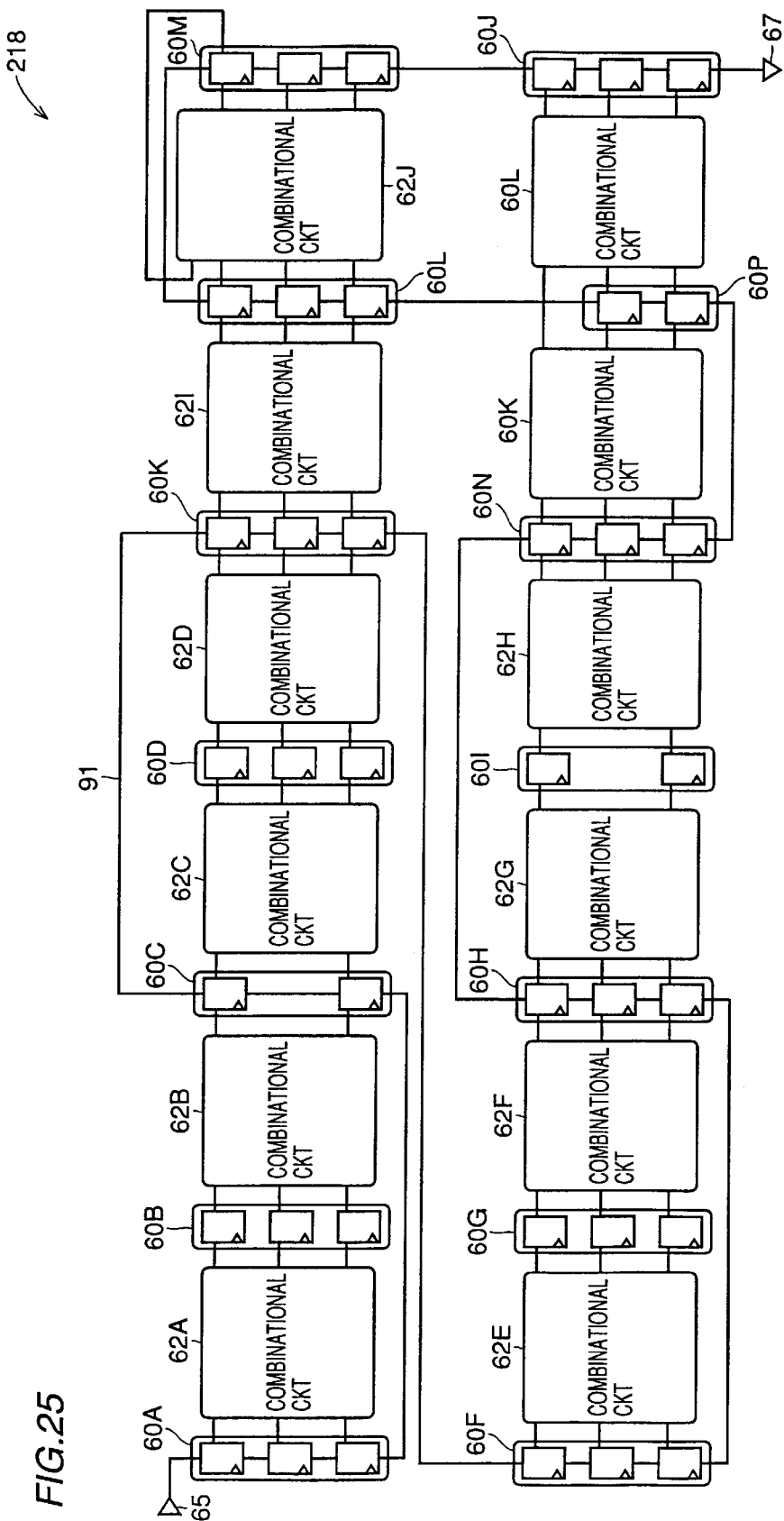
FIG. 25 is a circuit diagram showing a group of pipeline circuits 218 according to the sixth embodiment.

As in a group of circuits 218 shown in FIG. 25, the groups of FFs subjected to scan conversion can be connected by one scan chain 91. In this example, the pattern length of a test pattern generated is increased, although it is not necessary to provide selectors 87 and 89 as in the group of circuits 216 and the circuit added for scan test is thus reduced. Furthermore, the degree of freedom in the shifting order of scan FFs can be increased to construct a scan chain without disadvantageously affecting the layout.

For the pipeline circuit portions of each of the groups of circuits 216 and 218 described in the present embodiment, a circuit for scan test may be constructed according to the methods described in the second to fourth embodiments.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A pipeline circuit with a test circuit, comprising:

a pipeline circuit including a plurality of groups of flipflops arranged in series, and having a group of flipflops subjected to scan conversion and a group of flipflops not subjected to scan conversion, and a plurality of combinational circuits respectively arranged between said plurality of groups of flipflops and each having an input connected to an output of a group of flipflops at a previous stage and an output connected to a group of flipflops at a subsequent stage; and a scan chain interconnecting said groups of flipflops subjected to scan conversion.

2. The pipeline circuit with a test circuit according to claim 1, wherein said group of flipflops subjected to scan conversion is placed at every predetermined number of stages.

3. The pipeline circuit with a test circuit according to claim 2, wherein said predetermined number of stages is equal to a number of said combinational circuits.

4. The pipeline circuit with a test circuit according to claim 2, wherein said predetermined number of stages is smaller than a number of said combinational circuits.

5. The pipeline circuit with a test circuit according to claim 2, wherein:

said pipeline circuit includes first and second said pipeline circuits; and said scan chain of said first pipeline circuit and said scan chain of said second pipeline circuit are interconnected.

6. The pipeline circuit with a test circuit according to claim 5, wherein said predetermined number of stages of said first pipeline circuit is equal to said predetermined number of stages of said second pipeline circuit.

7. The pipeline circuit with a test circuit according to claim 5, wherein said predetermined number of stages of said first pipeline circuit is larger than said predetermined number of stages of said second pipeline circuit.

8. The pipeline circuit with a test circuit according to claim 7, wherein among said plurality of groups of flipflops of said second pipeline circuit, a group of flipflops at a most previous stage is a group of flipflops with data holding function.

9. The pipeline circuit with a test circuit according to claim 8, wherein said group of flipflop with data holding function is configured of a scan flipflop with data holding function, including a first selector, a second selector and a flipflop, said first selector having two inputs respectively connected to an internal data signal and an output of said flipflop and an output connected to an input of said second selector, said first selector determining a state in response to a data hold signal, said second selector having two inputs respectively connected to an output of said first selector and an output of a flipflop at a previous stage and an output connected to an input of said flipflop, said second selector determining a state in response to a scan enable signal, said flipflop having an input connected to an output of said second selector and output connected to an input of said first selector.

10. The pipeline circuit with a test circuit according to claim 2, wherein:

adjacent said groups of flipflops subjected to scan conversion sandwiches a largest number of stages; and of two adjacent groups of flipflops with a smaller number of stages than said largest value interposed therebetween, a group of flipflops at a previous stage is a group of flipflops with data holding function.

11. The pipeline circuit with a test circuit according to claim 1, wherein said pipeline circuit further includes a non-pipeline circuit portion having a plurality of groups of flipflops subjected to scan conversion and arranged in series, a combinational circuit, and a scan chain interconnecting said plurality of groups of flipflops subjected to scan conversion, said scan chain included in a portion other than said non-pipeline circuit and said scan chain included in said non-pipeline circuit being interconnected.

12. The pipeline circuit with a test circuit according to claim 11, further comprising a selector having inputs respectively connected to said scan chain included in a portion other than said non-pipeline circuit and to said scan chain included in said non-pipeline circuit, and an output connected to said group of flipflops subjected to scan conversion at a first stage of said non-pipeline circuit portion.

13. A pipeline circuit with a test circuit, comprising:

first and second pipeline circuits each including a plurality of groups of flipflops arranged in series, and a plurality of combinational circuits respectively arranged between said plurality of groups of flipflops and each having an input connected to an output of a group of flipflops at a previous stage and an output connected to a group of flipflops at a subsequent stage, said plurality of groups of flipflops in each of said first and second pipeline circuits having a group of flipflops at a first stage and a group of flipflops at a last stage both subjected to scan conversion;

a first scan chain interconnecting the groups of flipflops at respective said first stages of said first and second pipeline circuits; and a second scan chain interconnecting the groups of flipflops at respective said last stages of said first and second pipeline circuits.

14. An automatic test pattern generating method for testing a pipeline circuit with a test circuit, said pipeline circuit with a test circuit including a pipeline circuit having a plurality of groups of flipflops arranged in series and having a group of flipflops subjected to scan conversion and a group of flipflops not subjected to scan conversion and a plurality of combinational circuits respectively arranged between said plurality of groups of flipflops and each having an input connected to an output of a group of flipflops at a previous stage and having an output connected to a group of flipflops at a subsequent stage, and a scan chain interconnecting said groups of flipflops subjected to scan conversion, the method comprising the steps of:

constructing a data base capable of providing automatic test pattern generation for each said combinational circuit configuring each said pipeline circuit, with a plurality of said combinational circuits between said groups of flipflops subjected to scan conversion assumed as one circuit;

generating a full-scan automatic test pattern based on said data base; and formatting said full-scan automatic test pattern to provide a test pattern for scan test.

15. The automatic test pattern generating method according to claim 14, wherein said step of constructing includes the steps of:

short-circuiting a data input signal and a data output signal of each flipflop belonging to each said group of flipflops not subjected to scan conversion; and eliminating each flipflop belonging to each said group of flipflops subjected to scan conversion, and inserting an input terminal and an output terminal in place of each of the eliminated flipflops.

16. The automatic test pattern generating method according to claim 14, wherein said step of formatting includes the steps of:

outputting a first test pattern based on said test pattern for full-scan test to set data for said groups of flipflops subjected to scan conversion via said scan chain from said input terminal in scan test;

outputting a second test pattern to apply a capture clock a predetermined number of times determined to allow said data set for said groups of flipflops subjected to scan conversion to be taken into each of said combinational circuits successively; and outputting a third test pattern for reading data held in said groups of flipflops subjected to scan conversion from said output terminal, and observing the read data via said scan chain.

17. The automatic test pattern generating method according to claim 16, wherein:

said group of flipflops subjected to scan conversion is a group of flipflops placed at every predetermined number of stages; and the step of outputting said second test pattern includes outputting a test pattern to allow a frequency of application of a capture clock to be equal to said predetermined number of stages.

18. The automatic test pattern generating method according to claim 17, said pipeline circuit with a test circuit including first and second said pipeline circuits, said scan chain of said first pipeline circuit and said scan chain of said second pipeline circuit being interconnected, said predetermined number of stages of said first pipeline circuit being greater than said predetermined number of stages of said second pipeline circuit, said plurality of groups of flipflops of said second pipeline circuit having a group of flipflops at a most previous stage provided with data holding function, said group of flipflops provided with data holding function being configured of a scan flipflop with data holding function including a first selector, a second selector and a flipflop, said first selector having two inputs respectively connected to an internal data signal and an output of said flipflop and an output connected to an input of said second selector, said first selector determining a state in response to a data hold signal, said second selector having two inputs respectively connected to an output of said first selector and an output of a flipflop at a previous stage and an output connected to an input of said flipflop, said second selector determining a state in response to a scan enable signal, said flipflop having an input connected to an output of said second selector and an output connected to an input of said first selector, wherein the step of outputting said second test pattern includes the step of outputting a test pattern to allow a capture clock to be applied a same number of times as a largest one of said predetermined numbers of said first stages, and to set a data hold signal so that said first selector outputs an output of said flipflop and to set a scan enable signal so that said second selector outputs an output of said first selector when said capture clock is applied.

19. The automatic test pattern generating method according to claim 18, adjacent ones of said groups of flipflops subjected to scan conversion sandwiching a largest number of stages, two adjacent groups of flipflops with a smaller number of stages than said largest number interposed therebetween having a group of flipflops at a previous stage corresponding to said group of flipflops with data holding function, wherein the step of outputting said second test pattern applying said capture clock max_s times and outputting said test pattern to set said data hold signal so that said first selector outputs said output of said flipflop and to set said scan enable signal so that said second selector outputs said output of said first selector when a first to a (said max_s–min_s)th said capture clocks are applied and outputting said test pattern to set said data hold signal so that said first selector outputs said internal data signal and to set said scan enable signal so that said second selector outputs said output of said flipflop at the previous stage when said (max_s)th said capture clock is applied, said max_s representing a largest number of said combinational circuits interposed between a set of said groups of flipflops subjected to scan conversion, said min_s representing a smallest number of said combinational circuits interposed between a set of said groups of flipflops subjected to scan conversion.

* * * * *